United States Patent
Böttcher et al.

(10) Patent No.: US 11,742,435 B2
(45) Date of Patent: Aug. 29, 2023

(54) INTEGRATED CAPACITOR AND METHOD OF PRODUCING AN INTEGRATED CAPACITOR

(71) Applicant: Fraunhofer-Gesellschaft zur Förderung der angewandten Forschung e.V., Munich (DE)

(72) Inventors: Norman Böttcher, Erlangen (DE); Tobias Erlbacher, Erlangen (DE)

(73) Assignee: Fraunhofer-Gesellschaft zur Förderung der angewandten Forschung e.V., Munich (DE)

(*) Notice: Subject to any disclaimer, the term of this patent is extended or adjusted under 35 U.S.C. 154(b) by 0 days.

(21) Appl. No.: 17/223,799

(22) Filed: Apr. 6, 2021

(65) Prior Publication Data

US 2021/0257502 A1 Aug. 19, 2021

Related U.S. Application Data

(63) Continuation of application No. PCT/EP2019/077253, filed on Oct. 8, 2019.

(30) Foreign Application Priority Data

Oct. 9, 2018 (DE) .......................... 102018217249.8
Mar. 29, 2019 (DE) .......................... 102019204503.0

(51) Int. Cl.
*H01L 29/94* (2006.01)
*H01L 29/66* (2006.01)
*H01L 49/02* (2006.01)

(52) U.S. Cl.
CPC ............ *H01L 29/945* (2013.01); *H01L 28/40* (2013.01); *H01L 29/66181* (2013.01)

(58) Field of Classification Search
CPC . H01L 28/92; H01L 29/66181; H01L 29/945; H01L 21/0217; H01L 29/66174;
(Continued)

(56) References Cited

U.S. PATENT DOCUMENTS 4,990,463 A 2/1991 Mori
6,077,737 A 6/2000 Chu et al.
(Continued)

FOREIGN PATENT DOCUMENTS

DE 102014223904 A1 5/2016
JP 2001-111000 A 4/2001
(Continued)

OTHER PUBLICATIONS

S. Banzhaf et al, "Stress reduction in high voltage MIS capacitor fabrication," 19th International Symposium Power Electronics Ee2017, pp. 1-6, Novi Sad, Serbia, Oct. 2017, ISBN 978-1-5386-3503-2 (P).
(Continued)

*Primary Examiner* — Yu Chen
(74) *Attorney, Agent, or Firm* — Bridgeway IP Law Group, PLLC; Jihun Kim

(57) ABSTRACT

Integrated capacitor including a first electrode structure, a second electrode structure, and an interposed dielectric layer structure. The dielectric layer structure includes a layer combination having an $SiO_2$ layer, an $Si_3N_4$ layer, and an $Si_xN_y$ layer. The $Si_xN_y$ layer includes a non-stoichiometric silicon nitride material with an increased proportion of silicon.

15 Claims, 9 Drawing Sheets

(58) Field of Classification Search
CPC ....... H01L 29/66189; H01L 29/92–945; H01L 28/40–92; H01G 4/105; H01G 4/1272; H01G 4/08
See application file for complete search history.

(56) References Cited

U.S. PATENT DOCUMENTS

| | | | |
|---|---|---|---|
| 7,738,226 | B2 | 6/2010 | Berberich et al. |
| 2002/0195683 | A1 | 12/2002 | Kim et al. |
| 2004/0137686 | A1* | 7/2004 | Chen ............... H01L 27/105 257/E21.679 |
| 2005/0230784 | A1 | 10/2005 | Chua et al. |
| 2006/0180842 | A1 | 8/2006 | Miyazaki et al. |
| 2007/0264776 | A1 | 11/2007 | Dong et al. |
| 2008/0272424 | A1* | 11/2008 | Kim ............... H01L 21/3145 257/E21.21 |
| 2013/0134555 | A1 | 5/2013 | Kurachi et al. |
| 2016/0190230 | A1 | 6/2016 | Erlbacher et al. |

FOREIGN PATENT DOCUMENTS

| | | |
|---|---|---|
| JP | 2006-222390 A | 8/2006 |
| JP | 2013-115371 A | 6/2013 |
| WO | 0013236 A2 | 3/2000 |
| WO | 2017/145515 A1 | 8/2017 |

OTHER PUBLICATIONS

F. Krach et al., "Innovative monolithic RC-snubber for fast switching power modules," 9th International Conference an Integrated Power Electronics Systems CIPS2016, Nuremberg, Germany, 2016, pp. 1-6.

S. Banzhaf et al., "Post-trench processing of silicon deep trench capacitors for power electronic applications," 28th International Symposium on Powersemiconductor Devices and ICs ISPSD 2016, Prague, Czech Republic, 2016.

H. Hakim et al., "Nonlinear capacitors integration," Proc. Internal. Semiconductor Conference 2000, pp. 303-306 vol. 1, 2000, XP010527238.

J. Vom Dorp et al., "Dielectric layers suitable for high voltage integrated trench capacitors," J. Vac. Sci. Technol. B 29(1), 01AB04, vol. 29, No. 1, 2011, XP012144516.

F. Krach et al., "Silicon nitride, a high potential dielectric for 600 V integrated RC-snubber applications," Journal of Vacuum Science and Technology B, Nanotechnology and Microelectronics: Materials, Processing, Measurement and Phenomena, vol. 33, 2015, Article No. 01A1112, pp. 1-6, ISSN 2166-2746 (P).

J. Gardeniers et al., "LPCVD silicon-rich silicon nitride films for applications in micromechanics, studied with statistical experimental design," J. Vac. Sci. Technol. A 14(5), Sep./Oct. 1996.

Prodanovic et al., "Optimization of silicon-rich silicon nitride films for electron multiplication in timed photon counters", EUROSENSORS 2015.

T. Erlbacher et al., "Improving module performance and reliability in power electronic applications by monolithic integration of RC-snubbers", Proc. Internal. Symp. On Power Semicond. Dev. & ICs (ISPSD), Brügge, 283-286.

A. Ishitani et al., "Non-Empirical Modeling on SiNx Cvd", NEC Research and Development, Nippon Electric Ltd., Tokyo, JP, vol. 33, No. 1, Jan. 1992, pp. 1-6, XP000288331.

V.K. Mathews et al., "Physical and Electrical Characteristics of Thin Silicon Nitride Dielectric Films Deposited on Smooth and Rugged Polycrystalline Silicon after Rapid Thermal Nitridation", Journal of the Electrochemical Society, Electrochemical Society, vol. 141, No. 4, Apr. 1994, pp. 1066-1070, XP000453611.

F. Krach et al., "Silicon integrated RC snubbers for applications up to 900V with reduced mechanical stress and high nanufacturability", Jun. 19, 2016, 74th Annual Device Research Conference (DRC), IEEE, pp. 1-2, XP032948912.

K. Pelaic, "Einfluss des dielektrischen Schichtstapels auf die elektrischen Eigenschaften", 2018; please note that only the marked-up paragraphs are relevant to the invention (p. ix, last para is identical with its translation on p. xi, last para., plus the mark-ups on pp. 16-18, 20-23, 30, 32-37, 41-44, 46-49, 68, 70-74, 77, 79-83, 85 and 93-95.).

Takeyoshi Ichikawa, "Office Action for JP Application No. 2021-519598" dated Jun. 3, 2022, JPO, Japan.

* cited by examiner

| No | hole design | oxide | nitride 1 | nitride 2 | nitride 3 |
|---|---|---|---|---|---|
| $130_1$ | L10 | $SiO_2$ 330nm | $Si_3N_4$ 500nm | $Si_3N_4$ 500nm | $Si_3N_4$ 500nm |
| $130_2$ | L10 | $SiO_2$ 330nm | $Si_xN_y$ 500nm | $Si_xN_y$ 500nm | $Si_3N_4$ 500nm |
| $130_3$ | L10 | $SiO_2$ 330nm | $Si_3N_4$ 500nm | $Si_xN_y$ 500nm | $Si_3N_4$ 500nm |
| $130_4$ | L20 | $SiO_2$ 330nm | $Si_xN_y$ 500nm | $Si_3N_4$ 500nm | $Si_3N_4$ 500nm |
| $130_5$ | L20 | $SiO_2$ 330nm | $Si_3N_4$ 500nm | $Si_xN_y$ 500nm | $Si_3N_4$ 500nm |
| $130_6$ | L30 | $SiO_2$ 330nm | $Si_3N_4$ 500nm | $Si_xN_y$ 500nm | $Si_3N_4$ 500nm |
| $130_7$ | L30 | $SiO_2$ 330nm | $Si_xN_y$ 500nm | $Si_xN_y$ 500nm | $Si_3N_4$ 500nm |

| No | hole design | SiO2 | SiN 1 | SiN 2 | SiN 3 | $U_{IV, max}$ | $d_{overall}$ |
|---|---|---|---|---|---|---|---|
| $130_2$ | L10 | $SiO_2$ | $Si_xN_y$ | $Si_xN_y$ | $Si_3N_4$ | 1175 V | 2005.5 nm |
| $130_3$ | L10 | $SiO_2$ | $Si_3N_4$ | $Si_xN_y$ | $Si_3N_4$ | 1500 V | 2030.07 nm |
| $130_8$ | L10 | $SiO_2$ | $Si_xN_y$ | $Si_xN_y$ | $Si_xN_y$ | 875 V | 2102.9 nm |
| $130_5$ | L20 | $SiO_2$ | $Si_3N_4$ | $Si_xN_y$ | $Si_3N_4$ | 1450 V | 1936.7 nm | ific Application No. PCT/EP2019/077253, filed Oct. 8, 2019, which is incorporated herein by reference in its entirety, and additionally claims priority from German Applications Nos. DE 102018217249.8, filed Oct. 9, 2018, and DE 102019204503.0, filed Mar. 29, 2019, both of which are incorporated herein by reference in their entirety.

Embodiments in accordance with the invention relate to an integrated capacitor and to a method of producing an integrated capacitor.

BACKGROUND OF THE INVENTION

There are various concepts of reducing substrate distortion in manufacturing an integrated capacitor.

A known concept of reducing distortion of semiconductor wafers due to the asymmetry of the mechanical tension between the front and rear sides provides a compensation structure on the rear side of the wafer [1]. However, no concepts—that would be suitable in terms of manufacturing—for silicon capacitors for operating voltages of 900 V or more have been published so far that exhibit a capacitance density sufficient for commercial use. Therefore, ceramic or film capacitors have so far been predominantly used for applications within this voltage range.

Semiconductor technology, reliability and application of components of 200 V and 600 V were researched and described in the past in [3]—[5]. In addition, capacitors produced by monolithic integration have already been presented, in [6] and [7], for different applications and operating voltages. Utilization of $SiO_2$ and $Si_3N_4$ within a dielectric layer stack has been investigated in [8] and [9].

In order to reduce mechanical stress in silicon nitride layers, it has been known, in semiconductor technology, to use so-called stress-free nitride (non-stoichiometric silicon nitride with an increased proportion of silicon, referred to as $Si_xN_y$ in the following). [10] and [11] show that in this manner, among other things, mechanical stress may be reduced, or even stress reversion from tensile stress to compressive stress may be achieved. However, $Si_xN_y$ exhibits a higher defect concentration than $Si_3N_4$. Therefore, when utilizing a dielectric layer stack consisting exclusively of $SiO_2$ and $Si_xN_y$, leakage current increases to such an extent that the desired breakdown resistance cannot be achieved despite utilization of thick dielectric layers. At the same time, utilizing very thick layers is not practicable with regard to filling of the hole structures, and additionally reduces integration density. Replacing $Si_3Na$ by a non-stoichiometric, stress-free silicon nitride layer to increase the capacitance density in monolithically integrated capacitors (or RC snubbers) with similar layer thicknesses therefore is not expedient.

Against this background, there is a need for a concept which enables an improved compromise between improving the dielectric strength and the capacitance density of capacitors and reducing distortion as well as avoiding breakage of the semiconductor substrate or delamination of the dielectric in manufacturing of the capacitors while using thick dielectric layers.

SUMMARY

According to an embodiment, an integrated capacitor may have: a first electrode structure, a second electrode structure, and an interposed dielectric layer structure, the dielectric layer structure including a layer combination having an $SiO_2$ layer, an $Si_3Na$ layer, and an $Si_xN_y$ layer, and the $Si_xN_y$ layer including non-stoichiometric silicon nitride material with an increased proportion of silicon According to another embodiment, a method of producing an integrated capacitor may have the steps of: producing a dielectric layer structure within a trench structure of a semiconductor substrate, the dielectric layer structure including a plurality or a combination of mutually adjoining dielectric layers, at least one of the dielectric layers including $SiO_2$ material, at least one of the dielectric layers including $Si_3Na$ material, and at least one of the dielectric layers including $Si_xN_y$ material, the $Si_xN_y$ material including non-stoichiometric silicon nitride with an increased proportion of silicon.

In accordance with an embodiment, an integrated capacitor comprises a first electrode structure, a second electrode structure, and an interposed dielectric layer structure. The dielectric layer structure comprises, e. g., a layer combination having an $SiO_2$ layer, an $Si_3N_4$ layer, and an $Si_xN_y$ layer, and the $Si_xN_y$ layer may comprise a non-stoichiometric silicon nitride material with an increased proportion of silicon. Thus, the dielectric layer structure includes, e. g., at least three layers arranged in parallel with the first electrode structure and the second electrode structure. Thus, contact surfaces between the individual layers of the dielectric layer structure, a contact surface between the first electrode structure and the dielectric layer structure as well as a contact surface between the second electrode structure and the dielectric layer structure may be arranged in parallel with one another. Non-stoichiometric silicon nitride, also referred to as low-stress silicon nitride $Si_xN_y$, is composed of a modified ratio of silicon to nitrogen. In non-stoichiometric silicon nitride, the proportion of silicon is higher than that of nitrogen, which is why it has been given the byname of silicon-rich silicon nitride. The integrated capacitor may be, e. g., a planar plate capacitor or a trench capacitor, it being possible for very thick layers to be implemented on account of the trench capacitor.

This embodiment of the integrated capacitor is based on the finding that very large layer thicknesses may be implemented with non-stoichiometric silicon nitride since intrinsic tensions present within the $Si_xN_y$ layer are lower as compared to intrinsic tensions present in the $Si_3N_4$ layer (i. e. stoichiometric silicon nitride). By reducing the intrinsic tensions of the layers of the dielectric layer structure, excessive distortion of the first and/or second electrode structure(s) and/or delamination of the dielectric layer structure of the first electrode structure and/or the second electrode structure may be reduced or avoided. Within this context, the layer thickness is defined, e. g., as expansions of the $SiO_2$ layer, of the $Si_3N_4$ layer and/or of the $Si_xN_y$ layer which are perpendicular to the parallel contact surfaces between the individual layers of the dielectric layer structure.

For example, interaction of the $Si_3N_4$ layer and of the $Si_xN_y$ layer within the dielectric layer structure is made use of. Given a high permittivity of stoichiometric silicon nitride $Si_3N_4$, large layer thicknesses and, therefore, increased dielectric strength of the integrated capacitor may be achieved while the capacitance is higher, at the same time, as compared to capacitors comprising exclusively silicon dioxide within the dielectric. However, mechanical tensions scaling with the layer thickness may occur during manufacturing of semiconductor components comprising stoichiometric silicon nitride $Si_3N_4$, such as the integrated capacitor. So as to bypass, or reduce, limitation of the thickness of the dielectric layer, i. e. of the dielectric layer structure, on account of mechanical load, e. g., low-stress silicon nitride, i. e. the $Si_xN_y$ layer, is integrated into the dielectric layer structure (e. g. dielectric multi-layer stack).

In addition, the dielectric layer structure comprises an $SiO_2$ layer which may be arranged, in accordance with an embodiment, within the dielectric layer structure such that delamination of the dielectric layer structure of the first electrode structure is at least partially or completely avoided. In addition, $SiO_2$ on silicon exhibits very low interface states and a high electrical loading capacity. It is to be noted at this point that avoidance of delamination is achieved, at least partly, by utilizing the $SiO_2$ layer since said layer may compensate for tensions caused by nitride layers but since, additionally, the other layers of the dielectric layer structure also have an influence on delamination and, therefore, improve the integrated capacitor. Since in a border area between silicon substrate, which may comprise, e. g., the first electrode structure and/or the second electrode structure, and silicon nitride, there is a large density of surface states, silicon nitride will be/is used, in accordance with an embodiment, as a dielectric in connection with silicon dioxide as a dielectric layer of separation from the silicon substrate.

Thus, a monolithically integrated capacitor having a high dielectric strength and/or high capacitance density may be implemented by combined utilization of $Si_3N_4$ and $Si_xN_y$. The advantage results from a reduction of the mechanical stress while there is a low leakage current because of the dielectric layer structure at the same time. This enables implementing lower-cost silicon capacitors with clearly increased dielectric strength.

In accordance with an embodiment, the first electrode structure comprises a semiconductor substrate provided with a trench structure. For example, the electrode structure comprises rectangular or rounded-off recesses which have, e. g., the dielectric layer structure arranged thereat. Rectangular or rounded-off recesses within this context means, e. g., rectangular within a sectional view of the integrated capacitor, said sectional view being arranged in parallel with the layer thicknesses of the layers of the dielectric layer structure. In other words, the first electrode structure comprises, e. g., cylindrical and/or cuboid recesses. The trench structure is arranged to face, e. g., the second electrode structure. Because of the trench structure, a surface of the first electrode structure, which faces the second electrode structure (i. e., therefore, the surface comprising the trench structure), is enlarged as compared to a planar surface. This results in a high capacitance density. In accordance with an embodiment, the trench structure of the first electrode structure may comprise recesses and/or openings which face the second electrode structure and are hexagonally arranged, whereby the capacitance value of the integrated capacitor may be increased even more.

In accordance with an embodiment, the first electrode structure forms a rear-side electrode arranged at a rear-side contact; and the second electrode structure forms a front-side electrode arranged at a front-side contact.

In accordance with an embodiment, a ratio of silicon to nitrogen of the $Si_xN_y$ layer ranges from 0.8 to 1 (e. g. $0.8 \leq x/y \leq 1$). It is to be noted here that the $Si_xN_y$ layer is non-stoichiometric silicon nitride, wherein the proportion of silicon may be higher, as compared to nitrogen, than is the case in stoichiometric silicon nitride $Si_3N_4$. Since the ratio of silicon to nitrogen of the $Si_3N_4$ layer is 0.75, the ratio of silicon to nitrogen of the $Si_xN_y$ layer should range, e. g., from 0.76 to 1.5 or from 0.8 to 1. Said optimized ratio of silicon to nitrogen within the $Si_xN_y$ layer reduces distortion of the integrated capacitor and delamination of the dielectric layer structure from the first and/or second electrode structure(s). In addition, the breakdown voltage of the integrated capacitor is increased on account of the optimized ratio.

In accordance with an embodiment, the dielectric layer structure comprises a larger proportion of an $Si_3N_4$ material than of any material deviating therefrom. Thus, the dielectric layer structure may comprise, e. g., more or thicker $Si_3N_4$ layers than $SiO_2$ layers and/or $Si_xN_y$ layers. By means of this optimized combination of $Si_3N_4$ and $Si_xN_y$, thus, the advantages of a small leakage current (due to $Si_3N_4$) and reduced mechanical stress (due to $Si_xN_y$) may be advantageously combined. For implementing an optimized dielectric layer structure it is sufficient to substitute stress-free nitride $Si_xN_y$ for a portion that is smaller, in terms of percentage, than would initially be expected, since mechanical stress in the dielectric layer structure does not match the sum of the individual mechanical tensions of the individual layers.

In accordance with an embodiment, a thickness of the $Si_3N_4$ layer $d_{Si_3N_4}$ is formed to have a ratio of n to one to a thickness of the $Si_xN_y$ layer $d_{Si_xN_y}$, n ranging from 1.5 to 2.5. In other words, for example, an expansion of the $Si_3N_4$ layer $d_{Si_3N_4}$, which is perpendicular to mutually adjoining faces of the layers of the dielectric layer structure, has a ratio of n to one to an expansion of the $Si_xN_y$ layer $d_{Si_xN_y}$, which is perpendicular to mutually adjoining faces of the layers of the dielectric layer structure, n ranging from 1.5 to 2.5. The expansion of the $Si_3N_4$ layer, which is perpendicular to mutually adjoining faces of the layers of the dielectric layer structure, and the expansion of the $Si_xN_y$ layer, which is perpendicular to mutually adjoining faces of the layers of the dielectric layer structure, here and in the following are, e. g., thicknesses of the respective layer. The thickness may be, e. g., the smallest expansion among three expansions in the three spatial directions for the $Si_3N_4$ layer and/or the $Si_xN_y$ layer. Said definition may also be applied to thicknesses of other layers of the integrated capacitor that are described herein, e. g. to an $SiO_2$ layer, a substrate, an electrode structure (e. g. front-side electrode, rear-side electrode), etc.

In accordance with an embodiment, $n \geq 2$, as a result of which the expansion of the $Si_xN_y$ layer $d_{Si_xN_y}$ amounts to a maximum of 33% of the overall thickness of the dielectric layer structure, whereby possible leakage currents may be minimized. In accordance with an embodiment, the ratio is 2:1 (n=2), whereby the $Si_3N_4$ layer has an expansion that is, e. g., twice that of the $Si_xN_y$ layer. In accordance with an embodiment, the $Si_3N_4$ layer may comprise at least two $Si_3N_4$ sublayers which may be arranged separately from each other inside the dielectric layer structure, such as on opposite sides of the $Si_xN_y$ layer, for example. In this case, a first $Si_3N_4$ sublayer may comprise a first expansion perpendicular to mutually adjoining faces of the dielectric layer structure, and a second $Si_3N_4$ sublayer may comprise a second expansion perpendicular to mutually adjoining faces of the layers of the dielectric layer structure. Thus, the expansion of the $Si_3N_4$ layer may represent a sum of the first expansion and of the second expansion.

In accordance with an embodiment, a thickness of the $Si_3N_4$ layer is formed to have a ratio of n to one to a thickness of the $Si_xN_y$ layer, n ranging from 2 to 2.5, from 2 to 9, from 2 to 15, or from 2 to 32.

Generally, in accordance with an embodiment, the expansion of the $Si_3N_4$ layer may represent a sum of the expansions of, e. g., all of the $Si_3N_4$ sublayers, which are perpendicular to mutually adjoining faces of the layers of the dielectric layer structure. Likewise, the $Si_xN_y$ layer may comprise several $Si_xN_y$ sublayers, and, thus, the expansion of the $Si_xN_y$ layer may represent a sum of the expansions of all of the $Si_xN_y$ sublayers, which are perpendicular to mutually adjoining faces of the layers of the dielectric layer structure. Therefore, the ratio in accordance with an embodiment reflects the ratio of a sum of all expansions of $Si_3N_4$ sublayers to expansions of all $Si_xN_y$ sublayers. By means of said optimized ratio of the expansions of the layers of the dielectric layer structure, mechanical stress as well as leakage current within the dielectric layer structure is reduced.

In accordance with an embodiment, the $Si_xN_y$ layer is arranged separately from, or not directly adjacent to, the $SiO_2$ layer. For example, the $Si_3N_4$ layer may be arranged between the $Si_xN_y$ layer and the $SiO_2$ layer. If the $Si_xN_y$ layer is arranged directly on the $SiO_2$ layer, high intrinsic tensions may occur within the dielectric layer structure which may result in delamination of the layers. However, if the $Si_xN_y$ layer is arranged separately from, or not directly adjacent to, the $SiO_2$ layer, a boundary layer located between the $SiO_2$ layer and the $Si_xN_y$ layer cannot or can at least only partially absorb the stress, so that delamination of the layers may be reduced or prevented.

As a function of the depth, of the diameter and of the distance of the hole structures, sufficient stress reduction may also be achieved by means of thinner $Si_xN_y$ layers so as to achieve as low a leakage current as possible at the same time. In accordance with an embodiment, e. g., a layer stack of 700 nm of $Si_3N_4$, 200 nm of $Si_xN_y$, and 700 nm of $Si_xN_y$ may be used. It is to be noted here that it may be advantageous for the expansion of the $Si_xN_y$ layer to be clearly smaller than an expansion of the $Si_3N_4$ layers, which is perpendicular to mutually adjoining faces of the layers of the dielectric layer structure. Without the $Si_xN_y$ layer, manufacturing of $Si_3N_4$ layers of such thicknesses cannot be successful in the event of surface area enlargements due to hole structures of a factor of 5-15. In addition, it is to be noted that the expansion of the $Si_xN_y$ layer may represent a sum of all of the expansions of all $Si_xN_y$ layers (they may also be referred to as $Si_xN_y$ sublayers).

In accordance with an embodiment, the thickness of the $Si_xN_y$ layer $d_{Si_xN_y}$ corresponds to a maximum of 33% of the overall thickness of all $Si_xN_y$ layers and $Si_3N_4$ layers. In other words, the expansion of the $Si_xN_y$ layer $d_{Si_xN_y}$, which is perpendicular to mutually adjoining faces of the layers of the dielectric layer structure, amounts to a maximum of 33% of the overall expansion of all $Si_xN_y$ layers and $Si_3N_4$ layers, which is perpendicular to mutually adjoining faces of the layers of the dielectric layer structure. The effect of the $Si_xN_y$ layer here is in minimizing the influence of the mechanical stress (wafer distortion, delamination, crack formation), the electric properties (dielectric strength, leakage current, capacitance) here being influenced only to a minor extent as compared to thick layers. Alternatively, the expansion of the $Si_xN_y$ layer $d_{Si_xN_y}$, which is perpendicular to mutually adjoining faces of the layers of the dielectric layer structure, may amount to a maximum of ¼, ⅕ or ⅙ of the overall expansion of all $Si_xN_y$ layers and $Si_3N_4$ layers, which is perpendicular to mutually adjoining faces of the layers of the dielectric layer structure.

In accordance with an embodiment, a thickness of the $Si_xN_y$ layer corresponds to a maximum of 50% of an overall thickness of all $Si_3N_4$ layers. In other words, an expansion of the $Si_xN_y$ layer, which is perpendicular to mutually adjoining faces of the layers of the dielectric layer structure, amounts to a maximum of 50% of an overall expansion of all $Si_3N_4$ layers, which is perpendicular to mutually adjoining faces of the layers of the dielectric layer structure. Thus, e. g., $d_{Si_xN_y} \leq 0.5 \cdot d_{Si_3N_4}$ may apply. In accordance with an embodiment, the thickness of the $Si_xN_y$ layer may correspond to a lower limit of 1%, 3%, 6%, 8%, or 10% of the overall expansion of all $Si_3N_4$ layers. This proportion of the stress-free nitride is optimized to the effect that the integrated capacitor resists high field strengths, comprises low leakage currents and exhibits a large degree of voltage insulation. Specifically the leakage currents may be minimized in this manner since the presence of a 100% of an $Si_xN_y$ layer would result in very high leakage currents.

In accordance with an embodiment, the dielectric layer structure of the integrated capacitor comprises a thickness of at least 1200 nm and a dielectric strength of at least 900 V. In other words, the dielectric layer structure of the integrated capacitor comprises an expansion, which is perpendicular to mutually adjoining faces of the layers of the dielectric layer structure, of at least 1200 nm, whereby the integrated capacitor is configured to be operated at a voltage of at least 900 V. Thus, a high breakdown strength is achieved. For example, one permanently prevents a "breakdown" of the dielectric layer structure between a front-side electrode and a rear-side electrode when voltages of at least 900 V are present. In addition, the leakage current will remain, with at least 900 V, below a current density of 10 µA/cm² (or, alternatively, below a current density of 11 µA/cm², 9 µA/cm² or 8 µA/cm²). The minimum layer thickness of the entire dielectric layer structure may be fundamentally calculated via the relationship $$d_{min,eff} = \frac{U_{max}}{E_{crit,eff}}.$$

For non-stoichiometric nitride and differing layer-thickness ratios, it is obviously not possible to generally determine a general critical field strength. Depending on the composition of the dielectric layer structure (of the layer stack) and on the composition of the stress-free nitride, different minimum layer thicknesses will therefore result, e. g., for the same voltage class. Therefore, an average $$E_{crit} \approx 6.6 \frac{MV}{cm}$$

is used for Table 1. The effective oxide thickness results from calculating an $SiO_2$ layer thickness, which would result in the same capacitance as a layer stack comprised of $SiO_2$ and $Si_3N_4$. In accordance with an embodiment, the relationship $$d_{eff} = d_{SiO_2} + d_{Si_3N_4} \cdot \frac{3.9}{7.5}$$

applies, wherein $\varepsilon_{SiO_2}=3.9$ and $\varepsilon_{Si_3N_4}=7.5$. Thus, the values of Table 1 may be determined, within a wide range of voltage classes having the values indicated. Consequently, the integrated capacitor described herein is suitable for high operating voltages, for example.

TABLE 1

(features of embodiments of the integrated capacitor)

| Voltage class $U_{nominal}$ | Minimum effective thickness of the dielectric $d_{min}$ |
|---|---|
| 50 V | 75 nm (or 60 nm, 65 nm, 70 nm) |
| 200 V | 300 nm (or 270 nm, 280 nm, 290 nm) |
| 600 V | 900 nm (or 870 nm, 880 nm, 890 nm) |
| 900 V | 1330 nm (or 1130 nm, 1200 nm, 1270 nm) |

Table 1 has effective oxide thicknesses (EOT) indicated therein. Thus, a minimum effective thickness of 1330 nm for the voltage class of 900 V may signify, in accordance with an embodiment, that the dielectric layer structure comprises an overall thickness of 350 nm of $SiO_2$ layers and an overall thickness of 1500 nm of $Si_3N_4$ layers. Typical physical layer thicknesses are, e. g., 90 nm at 50 V, 520 nm at 200 V, 1300 nm at 600 V, and 1850 nm at 900 V. However, this also heavily depends on the ratio of $SiO_2$ to SiN of the layer thicknesses.

In accordance with an embodiment, the $Si_xN_y$ layer exhibits a thickness ranging from 50 nm to 2000 nm, from 50 nm to 1000 nm, from 50 nm to 500 nm, or from 100 nm to 1000 nm.

In accordance with an embodiment, a method of producing an integrated capacitor comprises the step of producing a dielectric layer structure within a trench structure of a semiconductor substrate. The dielectric layer structure comprises, e. g., a plurality or a combination of mutually adjoining dielectric layers, wherein at least one of the dielectric layers comprises an $SiO_2$ material, wherein at least one of the dielectric layers comprises an $Si_3N_4$ material, and wherein at least one of the dielectric layers comprises an $Si_xN_y$ material. The $Si_xN_y$ material comprises, e. g., non-stoichiometric silicon nitride having an increased proportion of silicon.

All of the above explanations regarding the device may also apply with regard to the respective corresponding embodiments of the method:

In accordance with an embodiment, the dielectric layer structure comprises a plurality or a combination of a dielectric layer comprising $SiO_2$ material, a dielectric layer comprising $Si_3N_4$ material, and a dielectric layer comprising $Si_xN_y$ material.

In accordance with an embodiment, a ratio of silicon to nitrogen of the dielectric layer comprising $Si_xN_y$ material ranges from 0.8 to 1 (e. g. $0.8 \leq x/y \leq 1$).

In accordance with an embodiment, the dielectric layer structure comprises a higher proportion of the $Si_3N_4$ material than of any material deviating therefrom. Thus, the dielectric layer structure may comprise, e. g., more or thicker dielectric layers comprising $Si_3N_4$ material than dielectric layers comprising $SiO_2$ material and/or than dielectric layers comprising $Si_xN_y$ material.

In accordance with an embodiment, an expansion $d_{Si_3N_4}$ of the dielectric layer comprising $Si_3N_4$ material, which expansion is perpendicular to mutually adjoining faces of the layers of the dielectric layer structure, has a ratio of n to one to an expansion $d_{Si_xN_y}$ of the dielectric layer comprising $Si_xN_y$ material, which expansion is perpendicular to mutually adjoining faces of the layers of the dielectric layer structure, n ranging from 1.5 to 2.5.

In accordance with an embodiment, the dielectric layer comprising $Si_xN_y$ material is not arranged directly at the $SiO_2$ layer.

In accordance with an embodiment, a method may be configured in accordance with any of the above-described embodiments.

In accordance with an embodiment, a device may be configured in accordance with any of the above-described embodiments.

In accordance with an embodiment, a production method may be configured in accordance with any of the above-described embodiments.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
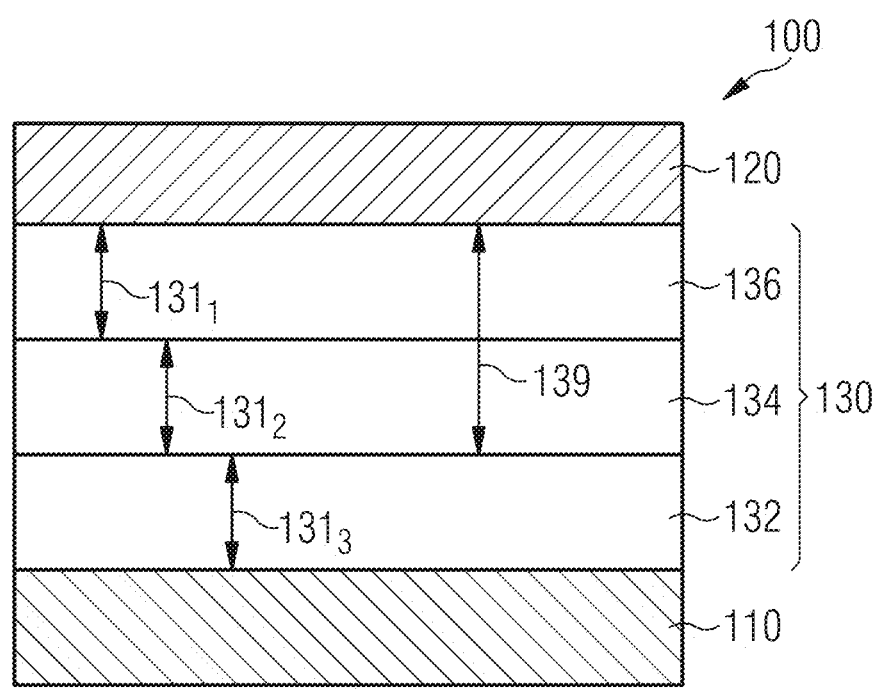
FIG. 1 shows a schematic representation of an integrated capacitor, in accordance with an embodiment of the present invention.

Before embodiments of the present invention will be explained in more detail below with reference to the drawings, it shall be noted that elements, objects and/or structures in the various figures which are identical or identical in function or in action have been provided with identical or similar reference numerals, so that the descriptions of said elements that are provided in the various embodiments are interchangeable and/or mutually applicable.

FIG. 1 shows an embodiment of an integrated capacitor 100 comprising a first electrode structure 110 and a second electrode structure 120. In addition, the integrated capacitor 100 comprises a dielectric layer structure 130 arranged between the first electrode structure 110 and the second electrode structure 120. The dielectric layer structure 130 comprises a layer combination having an $SiO_2$ layer 132, an $Si_3N_4$ layer 134, and an $Si_xN_y$ layer 136. The $Si_xN_y$ layer 136 comprises a non-stoichiometric silicon nitride material having an increased proportion of silicon. In accordance with an embodiment, the proportion of silicon of the $Si_xN_y$ layer 136 is increased as compared to the proportion of silicon of the $Si_3N_4$ layer 134.

In accordance with an embodiment, the first electrode structure 110 may comprise a semiconductor substrate. The semiconductor substrate may comprise p-doped silicon material. Doping of the silicon substrate contributes to increasing conductivity in a targeted manner. In accordance with an embodiment, the semiconductor substrate is doped with boron (B), an element of the third main group of the periodic table.

The second electrode structure 120 comprises polycrystalline silicon material (polysilicon), in accordance with an embodiment. Said material is a highly n-doped polycrystalline silicon, for example. Just like doping of the silicon substrate of the first electrode structure 110, this serves the purpose of increasing conductivity of the high-ohmic silicon. For example, phosphorus and argon, which are elements of the fifth main group of the periodic table, are used for doping.

In accordance with an embodiment, the first electrode structure 110 forms a rear-side electrode arranged at a rear-side contact, and the second electrode structure 120 forms a front-side electrode arranged at a front-side contact.

The core of the present invention lies in using a dielectric layer stack, i. e. the dielectric layer structure 130, consisting of a layer combination comprising an $SiO_2$ layer 132, an $Si_3N_4$ layer 134, and an $Si_xN_y$ layer 136. Within this context, the number and sequence of the partial layers 132 to 136, their layer thicknesses and the quantity ratio of silicon to nitrogen (x:y) in $Si_xN_y$ have a decisive influence on the producibility (in particular, reduction of a semiconductor wafer distortion and delamination) and the electric properties (in particular, increase of a breakdown voltage and capacitance density) of the integrated capacitor 100.

The silicon dioxide $SiO_2$ layer 132 exhibits the advantages of straightforward manufacturing and good insulation properties. In accordance with an embodiment, the $SiO_2$ layer 132 is arranged, due to lower interface states, within the dielectric layer structure 130, as a dielectric layer at an interface with the first electrode structure 110, e. g. the silicon substrate. So as to at least partly avoid delamination of the dielectric layer structure 130, the silicon dioxide layer 132 is arranged, in accordance with an embodiment, between the first electrode structure 110 and a silicon nitride layer such as the $Si_3N_4$ layer 134 or the $Si_xN_y$ layer 136, for example.

In accordance with an embodiment, the $Si_3N_4$ layer 134 comprises stoichiometric silicon nitride $Si_3N_4$ having a permittivity of 7.5, as a result of which it is possible to achieve higher layer thicknesses and, thus, increased dielectric strength of the integrated capacitor 100 while achieving higher capacitance as compared to using exclusively silicon dioxide within the dielectric. With stoichiometric silicon nitride, the stoichiometric ratio of the elements of silicon (Si) and nitrogen (N) is predefined as three to four.

In accordance with an embodiment, manufacturing of semiconductor devices comprising stoichiometric silicon nitride gives rise to mechanical tensions scaling with the layer thickness. So as to bypass limitation of the thickness of the dielectric layer on account of mechanical load, e. g., low-stress silicon nitride $Si_xN_y$ is integrated into the dielectric layer structure 130. Thus, the dielectric strength of the integrated capacitor 100 is increased by means of the low-stress silicon nitride since the increase in the thickness of the dielectric results in a shift of the dielectric breakdown toward higher voltages.

The $Si_xN_y$ layer 136 comprises non-stoichiometric silicon nitride material, also referred to as low-stress silicon nitride $Si_xN_y$. The non-stoichiometric silicon nitride is composed of a modified ratio of silicon to nitrogen in relation to the $Si_3N_4$ material. By using low-stress silicon nitride, larger layer thicknesses may be implemented since the intrinsic tensions of the layer are smaller than intrinsic tensions in stoichiometric silicon nitride.

In accordance with an embodiment, a ratio of silicon to nitrogen of the $Si_xN_y$ layer 136 ranges from 0.8 to 2, from 0.8 to 1.5, or from 0.8 to 1. With this ratio, the $Si_xN_y$ layer 136 comprises very little mechanical tension within the layer. By combining this $Si_xN_y$ layer 136 with the $Si_3N_4$ layer 134, the mechanical tension of the entire dielectric layer structure 130 is lower, in accordance with an embodiment, than a sum of the individual tensions of the individual layers of the dielectric layer structure 130.

A disadvantage of the low-stress silicon nitride $Si_xN_y$ is the fact that its defect concentration is higher than in stoichiometric nitride $Si_3N_4$. Due to the higher defect concentration in the $Si_xN_y$ layer 136, utilization of an $Si_3N_4$ layer 134 that is in contact with the upper electrode, i.e. the second electrode structure 120, is implemented in accordance with an embodiment, or combinations with a thin $Si_xN_y$ layer 136 in contact with the second electrode structure 120, which have a low leakage current. However, it is to be taken into account that a thicker $Si_xN_y$ layer 136 results in a higher leakage current, for example. By means of the inventive combination of $Si_3N_4$ 134 and $Si_xN_y$ 136, the advantages of the low leakage current (due to the $Si_3N_4$ layer 134) and of the reduced mechanical stress (due to the $Si_xN_y$ layer 136) may be united. In accordance with an embodiment, it is to be taken into account here that upon deposition of different silicon nitride layers (e. g. of the $Si_3N_4$ layer 134 and of the $Si_xN_y$ layer 136), the mechanical stress present in the entire layer stack, i. e. in the entire dielectric layer structure 130, does not match the sum of the individual mechanical tensions. For implementing a low-stress overall dielectric, i. e. the dielectric layer structure 130, it is therefore sufficient to replace a smaller part, in percentage, than might initially be expected by stress-free nitride $Si_xN_y$.

In accordance with an embodiment, the $Si_xN_y$ layer 136 is arranged separately from, or not directly adjacent to, the $SiO_2$ layer so as to at least partly avoid delamination of the layers. However, this also depends on the overall thickness of the dielectric layer structure 130 to be implemented and will be problematic, for example, with an $Si_3N_4$ layer 134 of a thickness of 1000 nm on an $Si_xN_y$ layer 136 of a thickness of 500 nm. All of the layer thicknesses indicated herein may be understood to be TARGET data. ACTUAL data may deviate from said TARGET data. For example, deviations of up to 10%, of up to 5% or of up to 2% from the TARGET data, which are due to, e. g., production- or design-related reasons, may occur.

In accordance with an embodiment, the dielectric layer structure 130 comprises a higher proportion of an $Si_3N_4$ material than of any material deviating therefrom. For example, the dielectric layer structure 130 may comprise more $Si_3N_4$ layers 134 than $SiO_2$ layers 132 and $Si_xN_y$ layers 136. Alternatively, the $Si_3N_4$ layer 134 may be configured to be thicker than the $SiO_2$ layer 132 and/or than the $Si_xN_y$ layer 136, with equal expansions of the mutually adjoining faces of the individual layers.

In accordance with an embodiment, an expansion $d_{Si_3N_4}$ $131_2$ of the $Si_3N_4$ layer 134, which is perpendicular to mutually adjoining faces of the layers of the dielectric layer structure 130, to an expansion $d_{Si_xN_y}$ $131_1$ of the $Si_xN_y$ layer 136, which is perpendicular to mutually adjoining faces of the layers of the dielectric layer structure 130, is configured in a ratio N:1, N ranging from 1.5 to 2.5. Thus, the layer stack comprises a higher proportion of $Si_3N_4$, such as the ratio $d_{Si_3N_4}$ $d_{Si_xN_y}$=2:1. The expansions $131_1$ to $131_3$, which are perpendicular to mutually adjoining faces of the layers of the dielectric layer structure, are the thicknesses of the individual layers 132 to 136, for example. In accordance with an embodiment, therefore, the thickness $131_2$ of the $Si_3N_4$ layer 134 is double the thickness $131_1$ of the $Si_xN_y$ layer 136, or, if the integrated capacitor 100 comprises a dielectric layer structure 130 having more than the three layers 132 to 136, an overall thickness of all of the $Si_3N_4$ layers 134 may be double an overall thickness of all of the $Si_xN_y$ layers 136.

So as to further increase the capacitance of the integrated capacitor 100, a surface area enlargement may be implemented in that the first electrode structure 110 comprises a semiconductor substrate provided with a trench structure.

The advantage of the inventive implementation is, in accordance with an embodiment, in realizing monolithically integrated capacitors 100 comprising high dielectric strength and/or high capacitance density on account of the combined utilization of $Si_3N_4$ 134 and $Si_xN_y$ 136. The advantage results from a reduction of the mechanical stress, with a simultaneously small leakage current, that is due to the dielectric layer stack, i. e. the dielectric layer structure 130. This enables implementing low-cost silicon capacitors with clearly increased dielectric strength. Optional features of the invention will be summarized in Table 2.

TABLE 2

(FEATURES OF EMBODIMENTS OF THE INVENTION):

| Feature | Potential embodiment |
| --- | --- |
| Surface enlargement K | 2 ≤ K ≤ 20 |
| Number N of nitride layers | 2 ≤ N ≤ 3 |

TABLE 2-continued (FEATURES OF EMBODIMENTS OF THE INVENTION):

| Feature | Potential embodiment |
| --- | --- |
| Order of layers 1 | $SiO_2 - Si_3N_4 - Si_xN_y$ |
| Order of layers 2 | $SiO_2 - Si_3N_4 - Si_xN_y - Si_3N_4$ |
| Order of layers 3 | $SiO_2 - Si_xN_y - Si_3N_4 - Si_xN_y$ |
| Layer thickness ratio | $d_{Si_xN_y} \leq 0.5 \cdot d_{Si_3N_4}$ |
| Quantity ratio in $Si_xN_y$ | $0.8 \leq x : y \leq 1$ |

In accordance with an embodiment of Table 2, the layer thickness $d_{Si_xN_y}$ of the $Si_xN_y$ layer amounts to a maximum of 50% of the layer thicknesses of all $Si_3N_4$ layers. Within this context, a minimum layer thickness $d_{Si_xN_y}$ of the $Si_xN_y$ layer may correspond to a lower limit of producibility. For example, the minimum layer thickness $d_{Si_xN_y}$ of the $Si_xN_y$ layer may amount to, e. g., 3% of the layer thicknesses of all of the $Si_3N_4$ layers. This means that the following relationship may apply for the layer thickness ratio, in accordance with an embodiment: $0.03 \cdot d_{Si_3N_4} \leq d_{Si_xN_y} \leq 0.5 \cdot d_{Si_3N_4}$.

A surface structure for increasing the surface area, and the architecture of the dielectric layer stack (number and thicknesses of the partial layers) may be determined via a cross-section analysis performed by means of a scanning electron microscope. For analyzing the quantity ratios of silicon and nitrogen and, eventually, the order of the partial layers, methods such as energy-dispersive X-ray spectroscopy or secondary-ion mass spectroscopy are possible.

Due to its extremely low parasitic series inductance, the silicon capacitor described is extremely suitable as a backup capacitor or attenuating element for voltage peaks or high-frequency oscillations (RC snubber) in switching applications involving very short switching times.

In accordance with an embodiment, the integrated capacitor 100 may be operated at operating voltages of up to 900 V or up to 1200 V on account of the combination of the $Si_3N_4$ layer 134 and the $Si_xN_y$ layer 136.

Figure 2A:
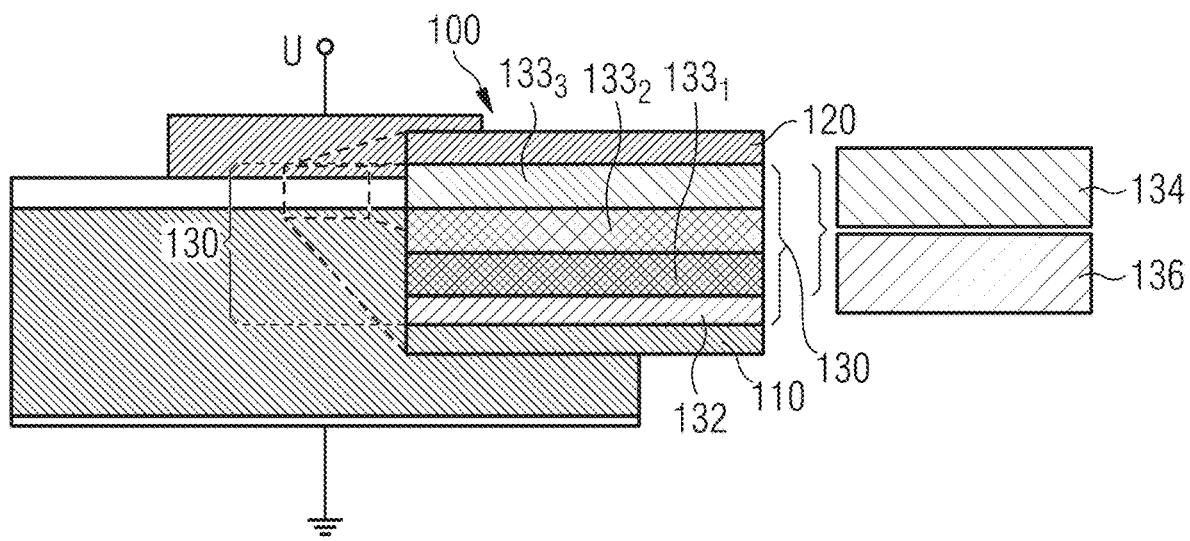
FIG. 2a shows a schematic representation of an integrated capacitor comprising a planar dielectric layer structure comprising four layers in accordance with an embodiment of the present invention.
Figure 2B:
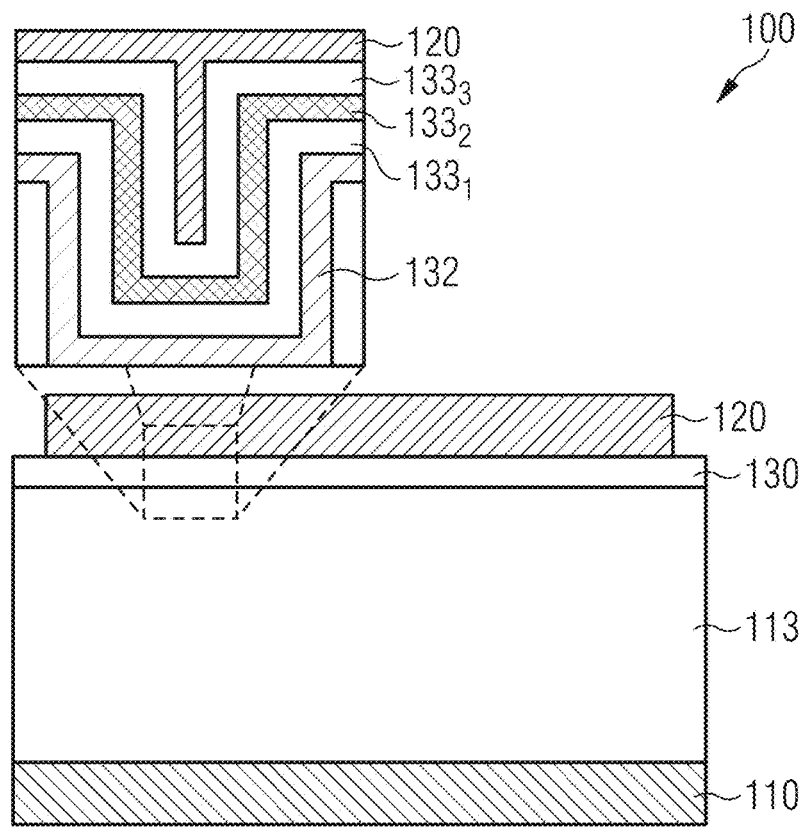
FIG. 2b shows a schematic representation of an integrated capacitor comprising a dielectric layer structure comprising four layers and a trench structure in accordance with an embodiment of the present invention.

Each of FIG. 2a and FIG. 2b shows a schematic representation of an inventive integrated capacitor 100 in accordance with an embodiment of the present invention. The integrated capacitor 100 in FIG. 2a and FIG. 2b may comprise the same features and functionalities as those of the integrated capacitor 100 of FIG. 1, the integrated capacitor 100 of FIGS. 2a and 2b differing from the integrated capacitor of FIG. 1 in that the dielectric layer structure 130 comprises three instead of two silicon nitride layers $133_1$ to $133_3$ in addition to the $SiO_2$ layer 132. The alternative dielectric layer structure 130 is arranged between the first electrode structure 110 and the second electrode structure 120. The integrated capacitors shown in FIG. 2a and in FIG. 2b differ from each other in that the integrated capacitor 100 in FIG. 2a may represent a plate capacitor, and the integrated capacitor in FIG. 2b may represent a trench capacitor.

What is characteristic for dielectrics is low conductivity and, therefore, high resistivity. For employing the material in a capacitor, high permittivity results in a high capacitance value. The breakdown field strength of the dielectric material is a measure of the breakdown strength of the dielectric and, therefore, of the dielectric strength of the capacitor 100. In accordance with an embodiment, in the integrated capacitor 100, the dielectric is represented by the dielectric layer structure 130. The dielectric of the inventive integrated capacitor 100 thus is present as a multi-layer system comprised of different dielectric materials.

In accordance with an embodiment, the silicon dioxide layer 132 is located at an interface with a small p-doped silicon substrate (i. e. with the first electrode structure 110 in FIG. 2a and/or with the substrate 113 in FIG. 2b). This is followed by a combination of three layers $133_1$ to $133_3$, e. g. of comparable thicknesses, of two silicon nitrides 134, 136. Thus, the silicon nitride layers $133_1$ to $133_3$ may comprise stoichiometric silicon nitride $Si_3N_4$ 134 and/or low-stress silicon nitride $Si_xN_y$ 136, which exhibit different electrical and mechanical properties.

In accordance with an embodiment, for example, layers $133_1$ and $133_3$ each comprise an $Si_3N_4$ layer 134, and the layer $133_2$ comprises an $Si_xN_y$ layer 136. Alternatively, any other two layers among the three layers $133_1$ to $133_3$ may represent the $Si_3N_4$ layer 134, and a third layer of the three layers $133_1$ to $133_3$ may represent the $Si_xN_y$ layer 136. Thus, e. g., two of the three silicon nitride layers $133_1$ to $133_3$ are $Si_3N_4$ layers 134, and one of the three silicon nitride layers $133_1$ to $133_3$ is an $Si_xN_y$ layer 136. For example, the first layer $133_1$ may be an $Si_3N_4$ layer 134, the second layer $133_2$ may be an $Si_xN_y$ layer 136, and the third layer $133_3$ may be an $Si_3N_4$ layer 134, such as in the previously described order of layers 2 in Table 2.

In accordance with an embodiment, alternatively, two of the three silicon nitride layers $133_1$ to $133_3$ each comprise an $Si_xN_y$ layer 136, and one of the three silicon nitride layers $133_1$ to $133_3$ comprises an $Si_3N_4$ layer 134, such as the previously described order of layers 3 in Table 2, wherein the first silicon nitride layer $133_1$ and the third silicon nitride layer $133_3$ comprise an $Si_xN_y$ layer 136, and the second silicon nitride layer $133_2$ comprises the $Si_3N_4$ layer 134.

In accordance with an embodiment, the dielectric layer structure 130 may comprise further silicon nitride layers $133_1$ to $133_3$ so as to further increase the thickness of the dielectric of the integrated capacitor 100 and, thus, also to increase the dielectric strength of the integrated capacitor 100.

Figure 3:
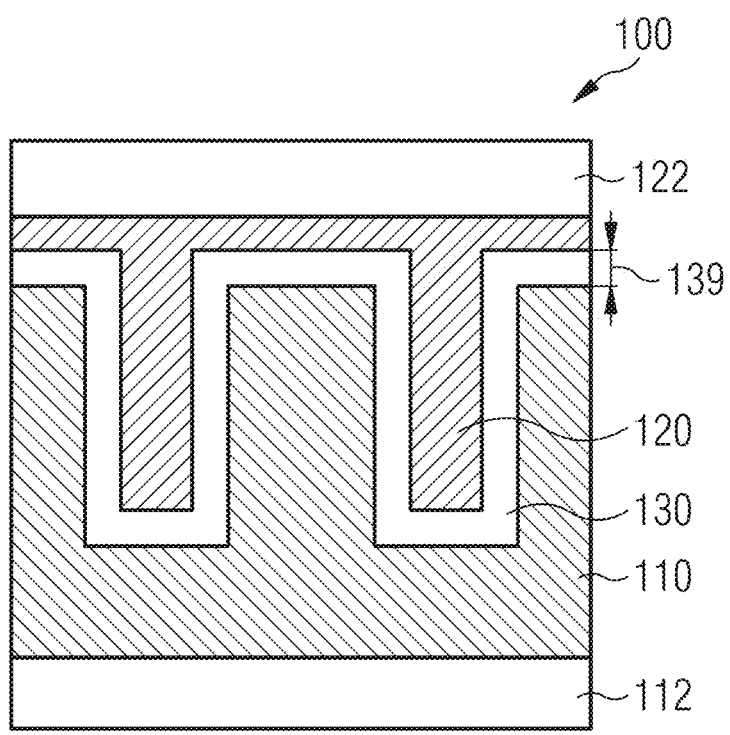
FIG. 3 shows a schematic representation of an integrated capacitor configured as a trench capacitor in accordance with an embodiment of the present invention.

FIG. 3 shows a schematic representation of an integrated capacitor 100 in accordance with an embodiment of the present invention. In accordance with an embodiment, a first electrode structure 110 of the capacitor 100 comprises a semiconductor substrate provided with a trench structure. The surface of the trench structure of the first electrode structure 110 has, e. g., a dielectric layer structure 130 of the integrated capacitor 100 arranged thereat. Thus, the dielectric layer structure 130 is arranged between the first electrode structure 110 and a second electrode structure 120.

In accordance with an embodiment, the first electrode structure 110 forms a rear-side electrode arranged at a rear-side contact 112, and the second electrode structure 120 forms a front-side electrode arranged at a front-side contact 122.

On account of the trench structure of the first electrode structure 110, the surface thereof is increased by the factor of K. The concept of a silicon trench capacitor (or silicon RC snubber) is known, inter alia, from [2]. Thus, in accordance with $$C = \epsilon_0 \cdot \epsilon_r \cdot \frac{K \cdot A}{d}, \quad (1)$$

a higher capacitance density is achieved as compared to a planar capacitor. In the formula, C corresponds to the capacitance value, $\epsilon_0$ corresponds to the electric field constant, $\epsilon_r$ corresponds to permittivity, and A corresponds to the surface of the dielectric, and d corresponds to the effective oxide thickness of the dielectric; the effective overall thickness d of the dielectric may include the entire effective silicon nitride thickness 139 and the effective thickness $131_3$ of the $SiO_2$ layer 132. Components of said technology have so far been published to have operating voltages of up to 600 V only. In accordance with an embodiment, the integrated capacitor 100 (which may also be referred to as a silicon trench capacitor) comprising the specific combination of an $Si_3N_4$ layer and an $Si_xN_y$ layer in the dielectric layer structure 130 presents a concept of operating voltages of up to 900 V or up to 1200 V. The core of the concept is a multi-layer dielectric (i. e., the dielectric layer structure 130) comprising at least one layer of silicon-rich silicon nitride for reducing the mechanical stress.

Scaling of the dielectric strength of the capacitor 100 (e. g. voltage class of 900 V) is effected by the effective oxide thickness of the dielectric 130. A breakdown voltage $U_{max}$ follows a relationship of a material-specific critical field strength $E_{crit}$ and a given effective oxide thickness d of the dielectric 130:

$$U_{max} = E_{crit} \cdot d_{eff} \quad (2)$$

However, as the thickness of the dielectric layer increases, so does its intrinsic mechanical tension. On account of the specifically developed dielectric layer structure 130, the mechanical tension present in the capacitor 100 and/or in the layers of the dielectric layer structure 130 may be kept small as the overall thickness 139 is increased, whereby, during manufacturing of the capacitor 100, pronounced distortions or breakage of the semiconductor substrate or delamination of the dielectric 130 itself may be at least partly prevented.

As can be seen from equations (1) and (2), the breakdown voltage of the capacitor 100 is directly proportional to the layer thickness 139 of the dielectric 130, whereas the capacitance is inversely proportional to it—breakdown voltage and capacitance density exhibit mutually inverse behaviors in terms of their respective dimensioning as a function of d. To achieve the original capacitance density (that was present prior to scaling of the dielectric strength) by means of a corresponding surface area enlargement is not possible if $SiO_2$ and $Si_3N_4$ are used exclusively since the mechanical stress additionally highly scales with the surface of the dielectric. The specific combination of $Si_3N_4$ and $Si_xN_y$, however, effectively reduces mechanical stress.

In accordance with an embodiment, e. g., a semiconductor substrate, or a layer of polysilicon, serves as an electrode 110, 120. The contacts 112, 122 are implemented with aluminum, for example.

FIG. 3 is a schematic cross section through an integrated capacitor 100, wherein, in accordance with an embodiment, the trench structure of the first electrode structure 110 is implemented by means of rectangular recesses. Even though the dielectric layer structure 130 is shown to be one single layer, the latter may comprise several layers such as an $SiO_2$ layer, an $Si_3N_4$ layer, and an $Si_xN_y$ layer.

In the following, further embodiments of FIG. 3 will be presented in different words: The capacitor 100 is, e. g., a silicon capacitor which may be successfully manufactured and characterized to have a dielectric strength of 1200 V. It was possible to reduce the high mechanical loads acting during processing by using low-stress silicon nitride in a dielectric stack, i. e. in the dielectric layer structure 130. In accordance with an embodiment, stoichiometric and low-stress silicon nitride were combined to form a multi-layer system, i. e. the dielectric layer structure 130 comprising three layers, at least one layer consisting of low-stress silicon nitride.

With the aid of a hexagonal hole structure, the surface area of the capacitors 100 was enlarged, in accordance with an embodiment. Any combinations of the layer stacks may be implemented, in accordance with an embodiment, to have a small hole depth L10, or selected layer stacks may be implemented to have a hole design L20 of a larger depth.

In accordance with an embodiment, the different material combinations in the dielectric layer structure 130 hardly have any influence on the capacitance values of the silicon capacitors 100. However, in accordance with an embodiment, it was possible to clearly increase the capacitance per area unit by about 80% because of an enlarged surface area caused by a deeper hole design L20 as compared to a smaller hole depth L10. The curve of the current/voltage characteristic of the components, i. e. of the capacitors 100, depends on the different dielectric layer stacks 130. This follows a system according to which, in accordance with an embodiment, a larger proportion of stoichiometric silicon nitride results in a larger maximum voltage that is achieved with a current flow of, e. g., 10 mA. The lower dielectric strength in layer stacks 130 which have a higher proportion of low-stress silicon nitride is attributed to, e. g., tunnel mechanisms within the dielectric. Due to the assumed higher trap concentration in the low-stress silicon nitride as compared to the stoichiometric silicon nitride, said charge transport mechanisms will dominate, e. g., already as from relatively low field strengths. The trap concentration was determined by means of temperature-dependent current/voltage measurements as a function of the electric field strength. In accordance with an embodiment, said measurements of the low-stress silicon nitride largely match those of the stoichiometric silicon nitride.

With silicon capacitors 100 which exhibit a dielectric layer stack 130 of silicon dioxide, two stoichiometric silicon nitride layers, and a low-stress silicon nitride layer, it was possible to achieve a maximum voltage of 1575 V at 10 mA.

To complete electrical characterization with regard to the different dielectric layer stacks 130 it is useful to determine the load limits of the silicon capacitors 100 as well as their long-range stabilities. In accordance with an embodiment, a series resistance of the silicon capacitor is independent of the architecture of the dielectric layer stack.

By using the low-stress silicon nitride, e. g., a degree of freedom is obtained with regard to the mechanical strains. On account of the findings from metrological documentation of the distortion of the silicon semiconductor wafer, i. e. of the first electrode structure 110, an enlargement of the surface area by means of deeper holes with a simultaneous layer composition having a hole design L30 (surface area enlargement more pronounced than with L20) and larger is possible. This goes hand in hand with increased capacitance per area unit. The hole depth may be further increased by an increased proportion of low-stress silicon nitride. Thus, silicon capacitors having high capacitances per area unit may be implemented. However, in accordance with an embodiment, the dielectric strengths of components having high proportions of low-stress silicon nitride are lower.

In accordance with an embodiment, the capacitor 100 represents an optimization with regard to a minimum proportion of low-stress silicon nitride and, thus, a maximum possible dielectric strength.

Further optional details of the trench structure of the first electrode structure 110 will be explained by means of FIGS. 4a, 4b, 5a, 5b, and 5c.

Figure 4A:
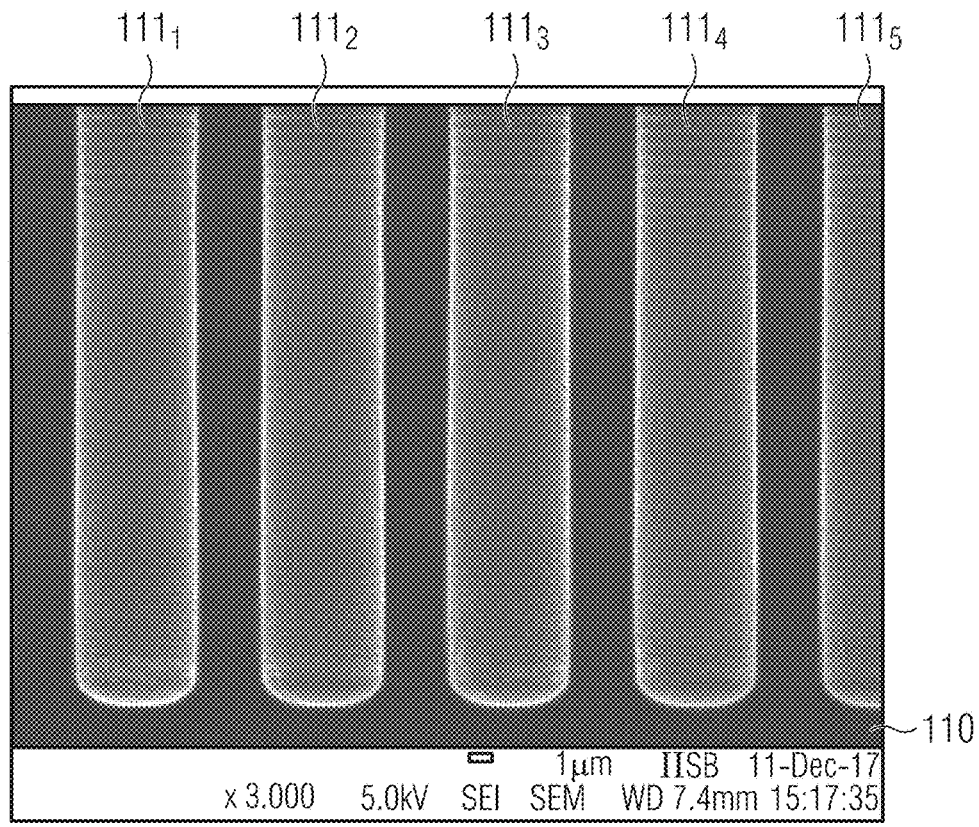
FIG. 4a shows a picture, on a scanning electron microscope, of a first electrode structure comprising a semiconductor substrate provided with a trench capacitor, in accordance with an embodiment of the present invention.

FIG. 4a shows a picture of a breaking edge of a silicon semiconductor wafer 110 comprising a hole structure $111_1$ to $111_5$ following a dry-etching process, said wafer 110 serving, in accordance with an embodiment of the present invention, as the first electrode structure of the integrated capacitor. The hole structure $111_1$ to $111_5$ may be implemented, for example, by means of an alternating dry-etching process such as an ASE (advanced silicon etching, reactive ion etching) process. As depicted in FIG. 4a, for example, this process will result in recesses $111_1$ to $111_5$. The recesses $111_1$ to $111_5$ may comprise cylindrical shapes with a sphere-shaped rounding at the end in the semiconductor substrate 110. Since FIG. 4a is a schematic cross section of the semiconductor substrate 110, the recesses $111_1$ to $111_5$ are depicted as rectangular recesses having rounded corners.

Figure 4B:
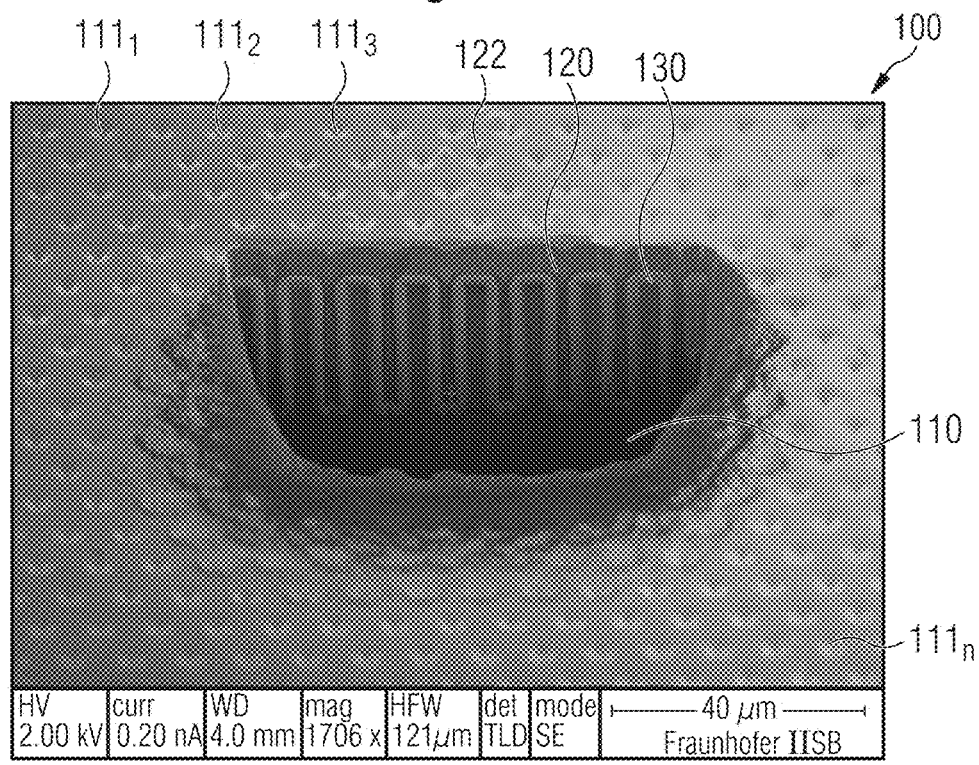
FIG. 4b shows a picture, on a scanning electron microscope, of a cross section of an integrated capacitor as a trench capacitor, in accordance with an embodiment of the present invention.

FIG. 4b shows a picture, on the scanning electron microscope, of a cross section of an integrated capacitor 100 in accordance with an embodiment. Therefore, a first electrode structure 110, a second electrode structure 120, and an interposed dielectric layer structure 130 become clear in FIG. 4b. Moreover, a front-side contact 122 is arranged on the second electrode structure 120.

By means of pictures on the scanning electron microscope as are shown, e. g., in FIG. 4a and/or FIG. 4b, structural parameters of the hole geometries of the trench structure of the first electrode structure 110 may be determined.

The trench structure of the semiconductor substrate 110 may comprise a multitude of recesses which may be identified, inter alia, in FIG. 4b by the depressions $111_1$ to $111_n$ in the front-side contact 122, n being a positive integer. In accordance with an embodiment, the recesses defining the trench structure of the semiconductor substrate 110 are circular holes. In accordance with the embodiment of the integrated capacitor 100 that is presented in FIG. 4b, the semiconductor substrate 110 comprises a hexagonal arrangement of the circular holes, which is indicated by the depressions $111_1$ to $111_n$ present on the front-side contact 122. This type of arrangement of holes provides, e. g., a very pronounced increase in the capacitance value of the integrated capacitor 100.

Figure 5A:
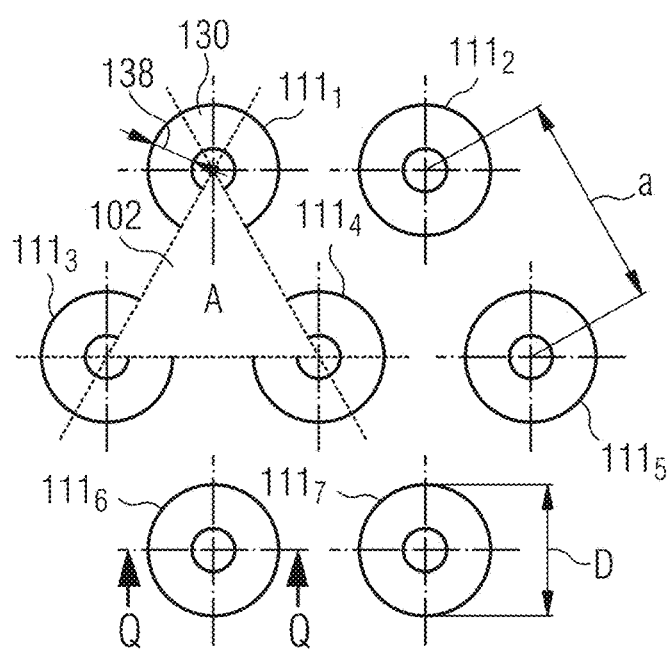
FIG. 5a shows a schematic representation of a top view of a trench structure of a semiconductor substrate of a first electrode structure of an integrated capacitor, in accordance with an embodiment of the present invention.
Figure 5B:
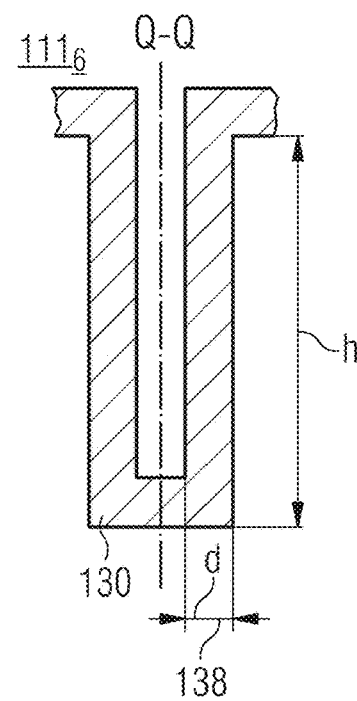
FIG. 5b shows a schematic representation of a cross section of a hole structure of a trench structure of a semiconductor substrate of an electrode structure of an integrated capacitor, in accordance with an embodiment of the present invention.

FIG. 5a is a schematic top view of a hexagonal hole structure as depicted for the integrated capacitor 100 of FIG. 4b. Moreover, FIG. 5b shows a cross section through a hole of the trench structure of the integrated capacitor along a cutting edge Q-Q in FIG. 5a. FIG. 5a and FIG. 5b serve to define parameters for calculating a surface area enlargement of the integrated capacitor by means of the hexagonally arranged hole structure. In said determining step one assumes, e. g., that the layer deposition of the dielectric materials of the dielectric layer structure 130 across the hole $111_1$ to $111_7$ is even. For calculating the enlargement factor of the surface area of the integrated capacitor, one takes the mean of a thickness d 138 of the dielectric layer structure 130. In accordance with FIGS. 5a and 5b, this serves as an orientation point for a distance a between the holes $111_1$ to $111_7$, a diameter D of the holes $111_1$ to $111_7$, and a depth h of the holes $111_1$ to $111_7$.

A capacitance $C_{hole\ structure}$ in an equilateral triangle 102 is composed of a capacitance of half a cylinder $C_{half\ cylinder}$, added to a capacitance of a planar face between the holes $C_{planar} - C_{semicircle}$ and to a capacitance of a bottom in the hole $C_{bottom}$. Thus, the following applies, in accordance with an embodiment, for the enlargement factor K of the surface area:

$$k = \frac{c_{hole\ structure}}{c_{planar}} = 1 + \frac{4\pi a}{\sqrt{3}\,a^2} \cdot \left( \frac{(d-D)}{2} + \frac{h-d}{\ln\left(\frac{D}{D-2d}\right)} \right).$$

In accordance with an embodiment, the structural parameters of the hole geometry may be predetermined. For example, the distance a between the holes may range from 1 µm to 5 µm, 2 µm to 3 µm, or 2.4 µm to 2.8 µm. The diameter D of the holes may range, in accordance with an embodiment, from 3 µm to 10 µm, from 4.5 µm to 6.5 µm, or from 5 µm to 6 µm. The depth h of the holes may range from 5 µm to 50 µm, from 10 µm to 40 µm, or from 10 µm to 35 µm. For example, a first hole design L10 may be implemented with a distance a of 2.75 µm, a diameter D of 5.35 µm, and a depth h of 12.3 µm. Alternatively, a hole design L20 may be implemented with a distance a of 2.48 µm, a diameter D of 5.59 µm, and a depth h of 22.5 µm. In addition, in accordance with an embodiment, a hole design L30 having a depth of about 30 µm may be realized.

Figure 5C:
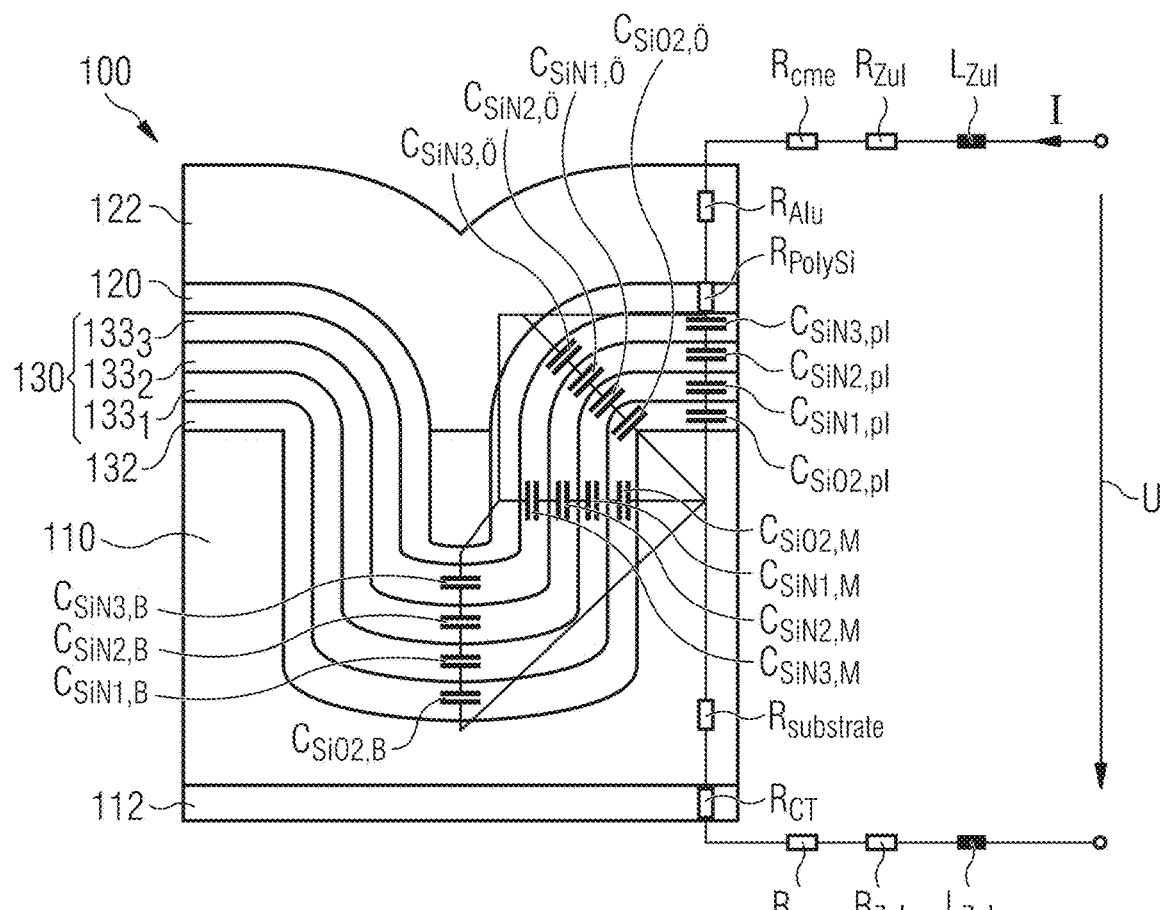
FIG. 5c shows a schematic equivalent circuit diagram of an integrated capacitor, in accordance with an embodiment of the present invention.

FIG. 5c shows an equivalent circuit diagram in accordance with an embodiment of an integrated capacitor 100 comprising partial capacitances of different layers and structures of a dielectric layer structure 130 and the individual resistances. The capacitance value measured is composed of individual capacitances of a parallel circuit along the dielectric layer boundaries and of a series circuit in accordance with the layer architecture. Within this context, e. g., the influences of a resistive voltage divider are neglected.

The dielectric layer structure 130 depicted in FIG. 5c may comprise the same features and properties as those of the dielectric layer structure 130 of FIG. 2a or FIG. 2b. For example, the integrated capacitor 100 in FIG. 5c comprises an $SiO_2$ layer 132, a first silicon nitride layer $133_1$, a second silicon nitride layer $133_2$, and a third silicon nitride layer $133_3$. Moreover, the integrated capacitor 100 of FIG. 5c comprises, in accordance with an embodiment, a first electrode structure 110, a second electrode structure 120, a rear-side contact 112, and a front-side contact 122.

During deposition of dielectric layers on the silicon substrate (the first electrode structure 110), mechanical tensions arise which affect the substrate. Said internal tensions of the deposited layers may be attributed to thermally induced tensions, on the one hand, and to intrinsic tensions, on the other hand. The different expansion coefficients of silicon substrate and of deposited layers 132 and $133_1$ to $133_3$ are mainly responsible for thermally induced tensions and are due to, e. g., the large temperature difference between a process temperature and an ambient temperature. Intrinsic tensions are to be attributed, inter alia, to foreign atoms, which substitute for atoms of the layer material or occupy interstitial positions. The lattice mismatch due to the different lattice constants between the different materials is, e.g., a further cause of intrinsic tensions.

The distortion of a silicon semiconductor wafer serving as a first electrode structure of a multiplicity of embodiments of the integrated capacitor 100 is a measurable quantity which allows making a statement about the extent of the inner tension within the dielectric layer structure 130. One distinguishes, e. g., between tensile stress, which causes concave distortion and/or a positive radius of curvature, and compressive stress, which causes convex distortion and/or a negative radius of curvature. Distortion of the silicon semiconductor wafer is measured both in parallel with and orthogonally to the flattening at the edge of the silicon semiconductor wafer. Its distortions exhibit congruent behavior, which is why what is documented in FIG. 6a are exclusively the maximum distortions of parallel measurements of the silicon semiconductor wafers for the sake of increased clarity.

Figures 6A, 6B:
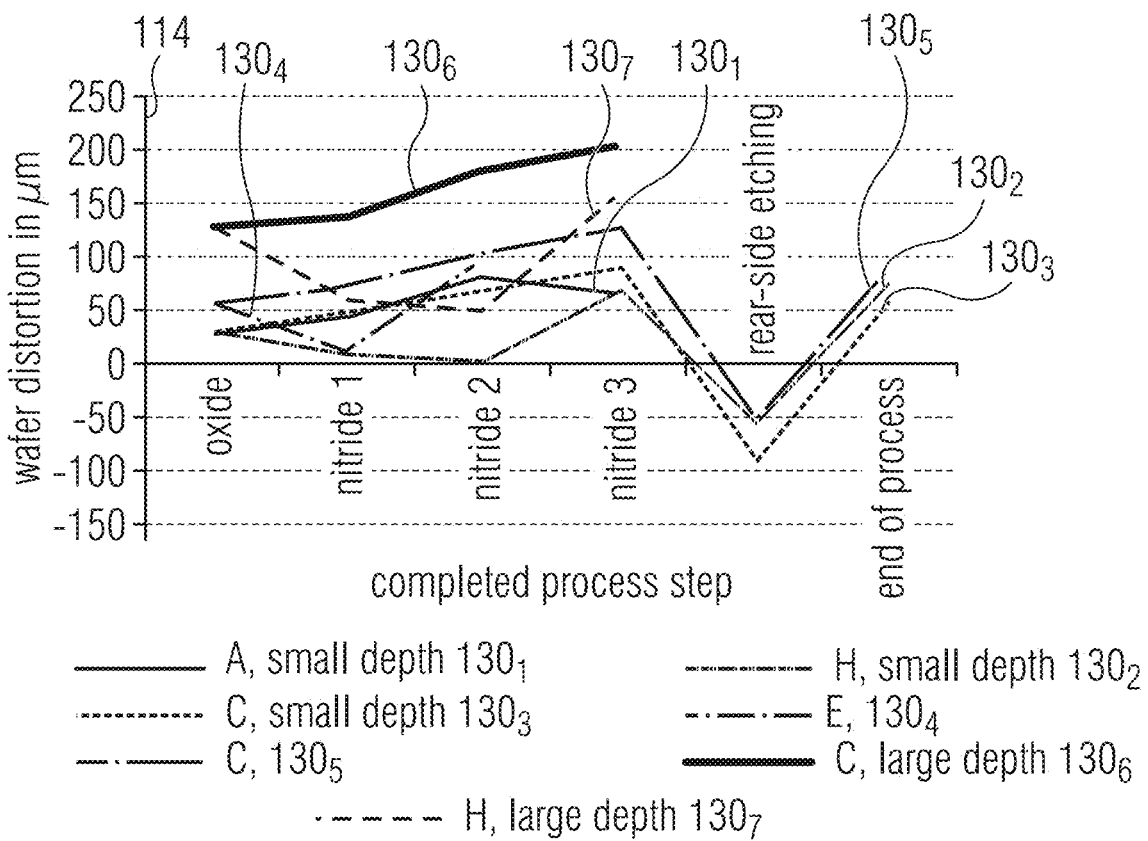
FIG. 6a shows a diagram of a distortion of silicon semiconductor wafers of different hole geometries in the event of individual dielectric layers being deposited, in accordance with an embodiment of the present invention.
FIG. 6b shows a table of the dielectric layer structures whose distortion of the silicon semiconductor wafer is shown across the individual deposition processes of the dielectric layer structure in FIG. 6a, in accordance with an embodiment of the present invention.

FIG. 6a shows a diagram depicting the distortion 114 of the silicon semiconductor wafers of different hole geometries upon deposition of the individual dielectric layers. In accordance with the embodiments depicted in FIG. 6a, the capacitors are inventive capacitors comprising trench structures, as in embodiments of FIGS. 3 to 5c, for example. The table of FIG. 6b depicts the layer architecture of the respective dielectric layer structures $130_1$ to $130_7$ examined in FIG. 6a. The differences between the hole designs L10, L20 and L30 was already discussed above in connection with FIGS. 5a and 5b. In accordance with an embodiment, FIG. 6a depicts distortions ranging from 0 µm to 200 µm (the axis of the distortion 114 is split up, e. g., in steps of 50 µm). FIG. 6a depicts only the distortions of specific embodiments, and it is clear that with alternative dielectric layer structures, distortions within other ranges may also be implemented. It is to be pointed out that the capacitor described herein is not limited to the parameters depicted in FIG. 6a and FIG. 6b As can be seen from the measurements of the wafer distortion, processing that has failed because of mechanical stress does not necessarily correlate with wafer distortion. For example, the wafers having the design $130_1$ will break even though they do not exhibit the maximum distortion. However, wafer distortion represents a limit for those process steps wherein the wafer may be "attached" to the chuck under vacuum (e. g. polyimide) or wherein a robot conveys the wafers.

In accordance with an embodiment, the inventive capacitor represents a concept for silicon capacitors having a dielectric strength of 1200 V. Within this context, one has found, with regard to the mechanical properties of the dielectric layer stack (i. e. of the dielectric layer structure), that the silicon semiconductor wafers having the dielectric layer stack with the architecture (cf. $130_4$ (E) in FIG. 6a and FIG. 6b) of 330 nm of silicon dioxide, 500 nm of low-stress silicon nitride, and 1000 nm of stoichiometric silicon nitride are highly delaminated following deposition of the second stoichiometric silicon nitride and therefore were not able to be processed further. In addition, it is to be noted that the silicon semiconductor wafer having the dielectric reference layer stack with the architecture (cf. FIG. 6a and FIG. 6b $130_1$ (A, small depth)) of 330 nm of silicon dioxide and 1500 nm of stoichiometric silicon nitride will burst, which is due to the high intrinsic tension that is mainly found in stoichiometric silicon nitride. Thus, an optimized combination of $SiO_2$ layer, $Si_3N_4$ layer, and $Si_xN_y$ layer, as is described in the dielectric layer structure in accordance with $130_2$ (H, small depth), $130_3$ (C, small depth), $130_5$ (C), $130_6$ (C, large depth) and $130_7$ (H, large depth), is advantageous for the integrated capacitor with regard to a reduction of delamination and straightforward producibility of the integrated capacitor.

Upon establishing the different dielectric layer stacks of the delaminated and broken silicon semiconductor wafers it becomes clear that significant distortion of the silicon semiconductor wafer is not necessarily causally related to a high intrinsic tension. This becomes clear essentially when comparing the maximum value of the largest expansion of the distortion between the broken silicon semiconductor wafer ($130_1$ (A, small depth), comprising a distortion of, e. g., 80

μm) to the dielectric layer stack having a deep hole design with 1000 nm of stoichiometric silicon nitride and 500 nm of low-stress silicon nitride (130₆ (C, large depth), comprising a distortion of, e. g., 200 μm). One possible cause is the interaction of the coefficient of thermal expansion and modulus of elasticity. Likewise, it is also conceivable that a relaxation of the crystal structure has already occurred by the time of measurement of the distortion.

Figure 7:
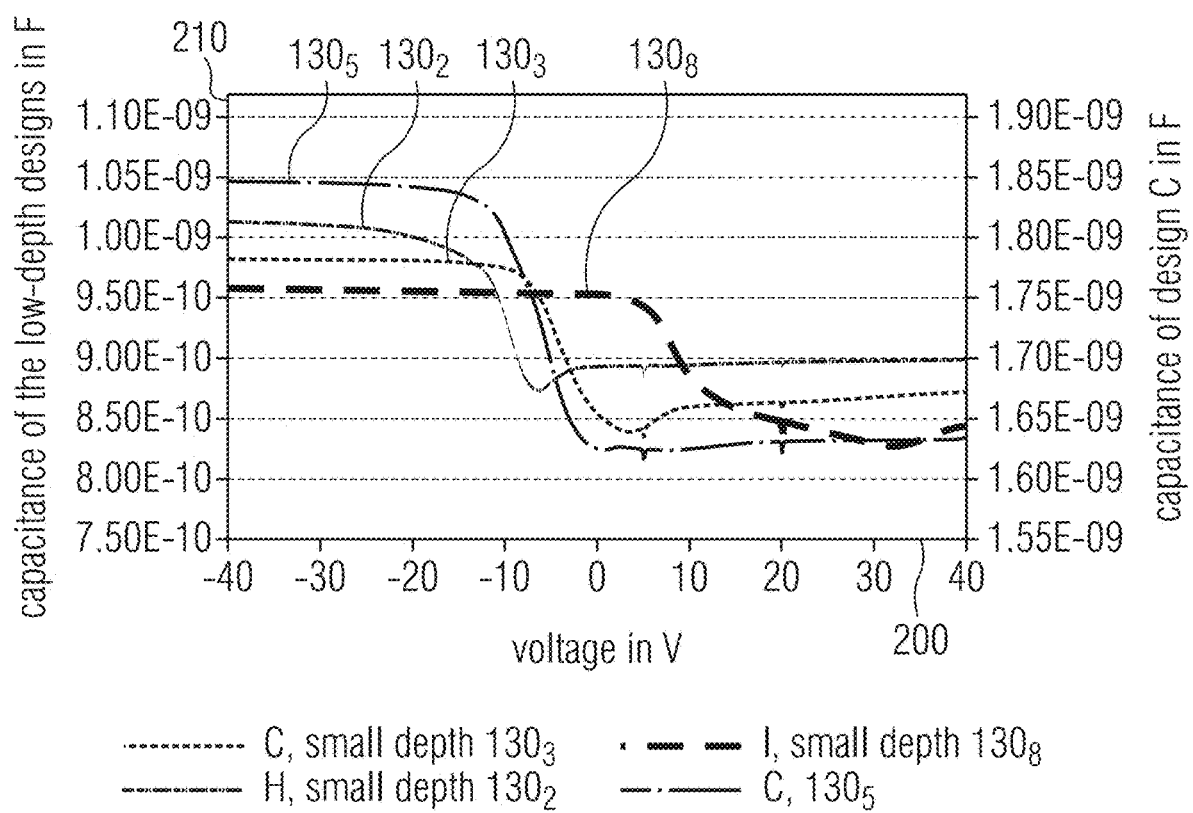
FIG. 7 shows a diagram of a capacitance/voltage characteristic of an integrated capacitor, in accordance with an embodiment of the present invention.

FIG. 7 depicts a capacitance/voltage characteristic (C(U) characteristic) of the inventive capacitor. The capacitance/voltage characteristic of an MIS capacitor exhibits a characteristic curve due to the voltage dependency of the width of the space-charge region within the substrate.

For capturing the C(U) characteristic, a direct voltage 200 of −40 V to +40 V is applied (the axis of the direct voltage 200 being split up, e. g., in steps of 10 V), which is superposed by an alternating voltage having an amplitude of, e. g., 10 mV and 100 kHz. The capacitive and resistive portions of the impedance is determined from the amplitude and phase of the current flow. Upon the start at the negative voltage up to the positive voltage, the forward characteristic and the backward characteristic are captured upon reverse passing through the voltage ramp from +40 V to −40 V.

In accordance with an embodiment, FIG. 7 depicts capacitances 210 within a range from $0.75*10^{-9}$ F to $1.1*10^{-9}$ F in steps of $0.05*10^{-9}$ F for the hole design L10, and within a range from $1.55*10^{-9}$ F to $1.9*10^{-9}$ F in steps of $0.05*10^{-9}$ F for the hole design L20. FIG. 7 depicts only the C(U) characteristic of specific embodiments, and it is clear that with alternative dielectric layer structures, C(U) characteristics may also be implemented within other ranges. It is to be noted that the capacitor described herein is not limited to the parameters depicted in FIG. 7 and FIG. 8b.

The capacitance/voltage measurements were performed, by way of example, on several non-charged capacitors (see FIG. 8b for parameters with regard to the capacitors analyzed) on several silicon semiconductor wafers. FIG. 7 shows the C(U) characteristics of three components from the center of, respectively, a silicon semiconductor wafer having the hole design L10 and of a component from the center of a silicon semiconductor wafer having the hole design L20.

With the negative voltage of, e. g., −40 V, the p-MIS capacitors are operated in accumulation, in accordance with an embodiment. In an accumulation mode of the capacitor, the characteristic approximates a capacitance value (see FIG. 7). However, said approximation does not take place with all of the capacitors examined. With the components, e. g. 130₂ (H, small depth), of the silicon semiconductor wafers having the dielectric layer combinations comprising a stoichiometric silicon nitride layer as the second or third silicon nitride deposition, the value of the capacitance increases, e. g., as the voltage decreases, so that the capacitance value cannot be directly determined, in the accumulation mode of the capacitor, by means of this measurement setup.

If one compares the results between the hole designs L10 and L20, it may be found that the components, e. g. 130₅ (C), located on the silicon semiconductor wafers having the hole design L20 exhibit higher capacitances than the components, e. g. 130₂ (H, small depth), 130₃ (C, small depth), and 130₈ (I, small depth), located on the silicon semiconductor wafers having the hole design L10. The reason is the larger surface area that is due to the deeper holes of the hole design L20 as compared to the surface area of the hole design L10.

An overall permittivity of a dielectric stack is higher when it has a higher proportion of low-stress silicon nitride. As a result, the capacitance also increases. A larger thickness of the dielectric stack entails a lower capacitance value. Accordingly, the capacitance value of the silicon semiconductor wafer 130₂ (H, small depth) (see FIG. 6b and FIG. 7) is increased because of a pronounced discrepancy between a smaller thickness and a higher overall permittivity.

For determining the dielectric strength and for identifying different charge transport mechanisms within the capacitor, capturing a current/voltage characteristic of the inventive capacitors is suitable. The dielectric strength of a capacitor is, e. g., dependent on the thickness of the dielectric (i. e. of the dielectric layer structure) and on the electric field strength. An irreversible breakdown of the dielectric takes place when a critical field strength $E_{crit}$ is exceeded at a breakdown voltage $U_{BD}$ present. The maximally achieved voltage $U_{IV,max}$ ist determined at a current flow of 10 mA. With none of the measured layer stacks, a dielectric breakdown can be found up to the maximally achieved voltage. The breakdown voltage is therefore higher than the maximally achieved voltage, so that the producibility of capacitors having dielectric strengths of 1200 V can be successfully confirmed.

Figures 8A, 8B:
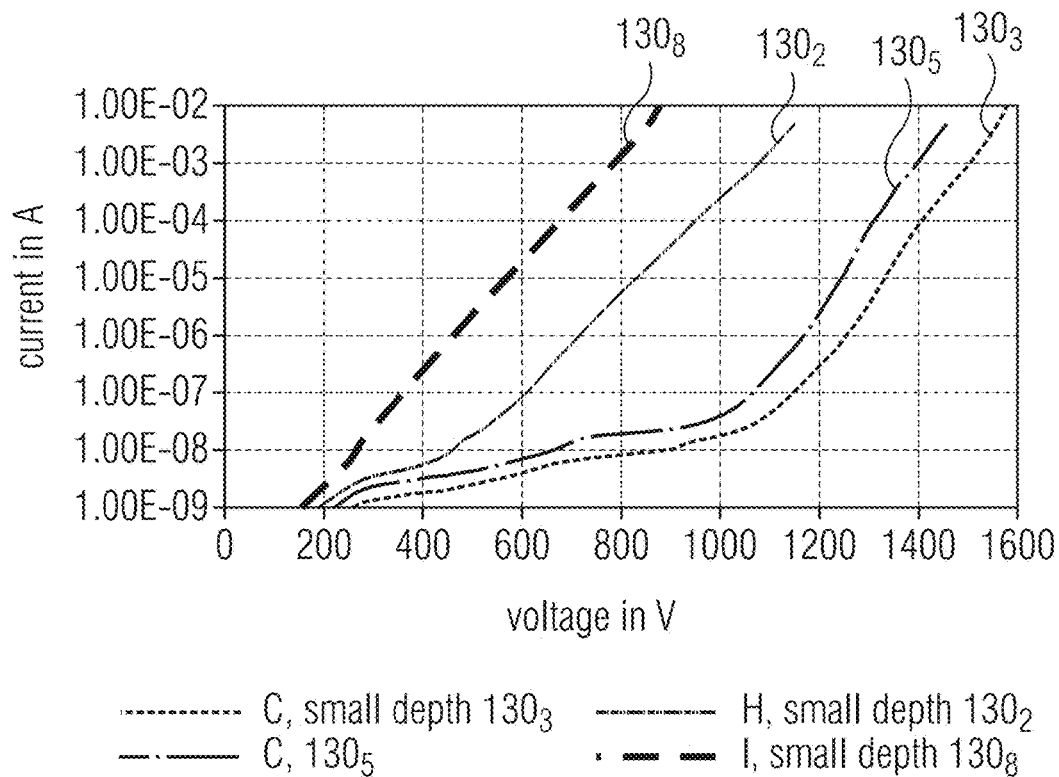
FIG. 8a shows a diagram of current/voltage characteristics of several integrated capacitors, in accordance with an embodiment of the present invention, as compared to a capacitor having a dielectric made of silicon dioxide and exclusively silicon-rich nitride.
FIG. 8b shows a table of the dielectric layer structures, of the integrated capacitors, whose current/voltage characteristics are depicted in FIG. 8a, in accordance with an embodiment of the present invention.

The current/voltage characteristic of a component from the center of each silicon semiconductor wafer is depicted in FIG. 8a. In other words, FIG. 8a depicts measured output characteristics of Si capacitors with a dielectric composed of silicon dioxide and silicon-rich nitride (130₈ (I, small depth)) and a combination of silicon-rich and stoichiometric nitride (130₂ (H, small depth), 130₃ (C, small depth), 130₅ (C)) of equal or similar overall thicknesses. In accordance with an embodiment, FIG. 8a shows the current measured at the component as a function of the voltage applied. Within this context, the current is depicted in logarithmic terms, e. g. within a range from $10^{-9}$ A to $10^{-2}$ A, and the voltage is depicted, e. g., within a range from 0 V to 1600 V, in steps of 200 V. FIG. 8a depicts the current as a function of the voltage of specific embodiments only, and it is clear that with alternative dielectric layer structures, currents within different ranges (e. g. within different current and/or voltage ranges) may be implemented. It is to be noted that the capacitor described herein is not limited to the parameters depicted in FIG. 8a and FIG. 8b. An advantageous embodiment of the present invention is represented by the capacitor having the dielectric layer structure in accordance with 130₃ (C, small depth).

FIG. 8b shows the different layer stacks that are analyzed in FIG. 8a, with the maximally achieved voltage and the overall layer thickness of the dielectric.

FIG. 8a clearly shows the higher voltages achieved with the dielectric multi-layer systems comprising two stoichiometric silicon nitride layers (130₅ (C), 130₃ (C, small depth)) as compared to the dielectric layer stack consisting exclusively of low-stress silicon nitride (130₈ (I, small depth)) and as compared to the dielectric layer variations comprising a stoichiometric silicon nitride layer (130₂ (H, small depth)). Thus, the integrated capacitor described herein is optimized as compared to general capacitors having a layer architecture of 130₈. A comparison of the current/voltage characteristic of the components having a stoichiometric silicon nitride layer (130₂ (H, small depth)) reveals that the contact between stoichiometric silicon nitride and the underlying silicon dioxide is advantageous in terms of a higher maximally achieved voltage. The contact between low-stress silicon nitride and the front-side electrode, which might have a negative effect on the current/voltage characteristic on account of the higher defect density present in low-stress silicon nitride as compared to stoichiometric silicon nitride (130₂ (H, small depth), 130₃ (C, small depth)), is not confirmed by measurements.

The influence of the enlarged surface area of the components that is due to deeper holes becomes clear, with regard to the current/voltage characteristic, in that the maximally achieved voltage of the components having a hole design L20 ($130_5$ (C)) is lower as compared to those components of the same dielectric layer stack which have the hole design L10 ($130_2$ (H, small depth), $130_3$ (C, small depth)). Possible reasons are the additional vacancies that are present at the interface with the electrode because of the enlarged surface area, on the one hand. On the other hand, the overall thickness of the dielectric is smaller since, in accordance with an embodiment, the deposition rate of the dielectric layers during manufacturing is not adapted despite the larger surface area.

In accordance with an embodiment, a silicon capacitor (such as, e. g., $130_5$ (C)), the trench structure of which comprises a hole depth of about 20 μm and which comprises a dielectric layer stack of 330 nm of silicon dioxide, 500 nm of stoichiometric silicon nitride, 500 nm of low-stress silicon nitride, and 500 nm of stoichiometric silicon nitride, offers an optimized concept in terms of capacitance and dielectric strength. Thus, one achieves a capacitance, per area unit, of 133 pF/mm² and a dielectric strength of 1450 V.

Figure 9:
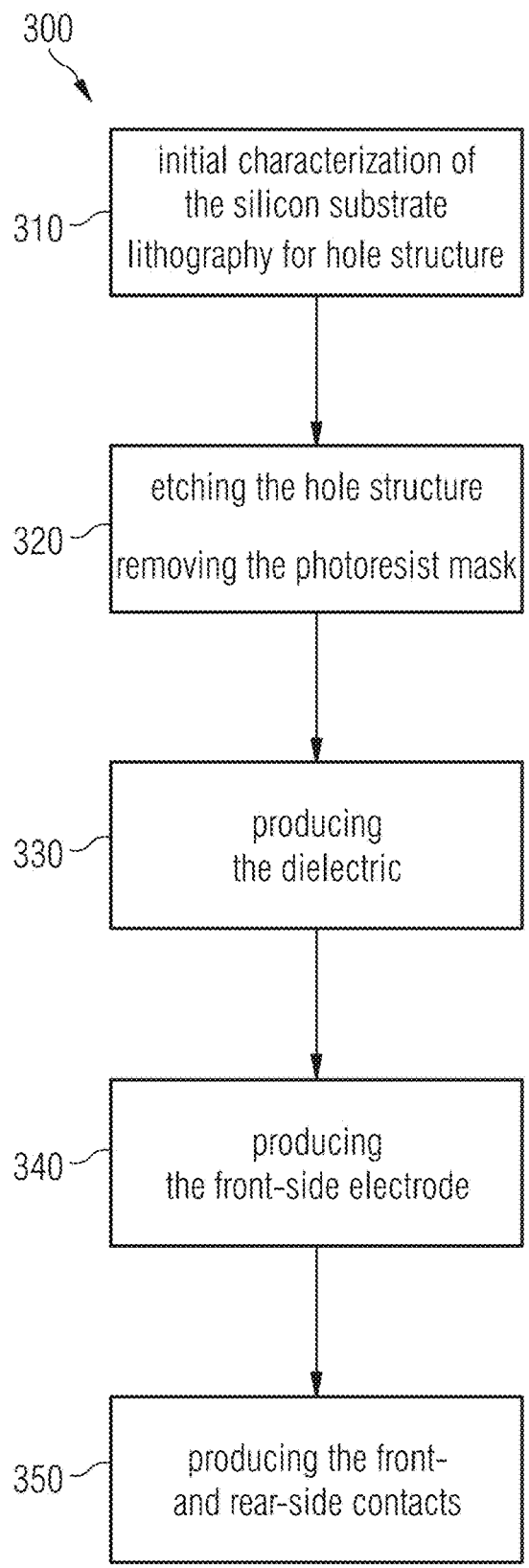
FIG. 9 shows a block diagram and a schematic representation of a sequence of steps of producing an integrated capacitor, in accordance with an embodiment of the present invention.
Figure 9:
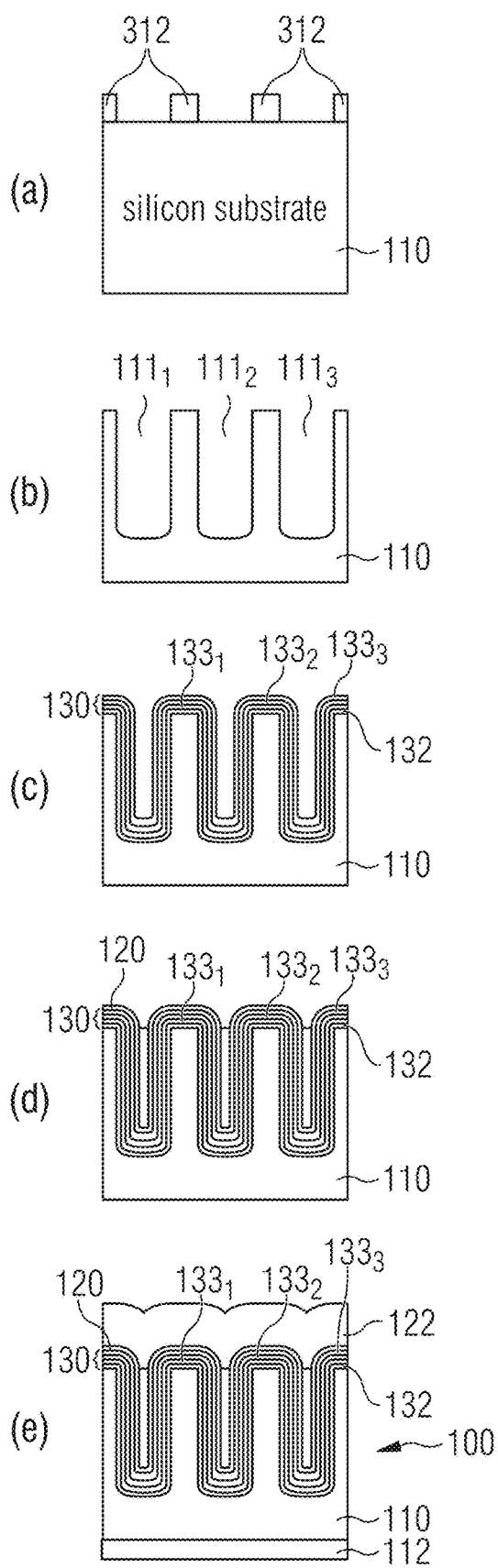

FIG. 9 schematically shows individual consecutive process steps of a method 300 of manufacturing the inventive silicon capacitors in accordance with an embodiment of the present invention. Within this context, particular attention is to be paid to the fact that FIG. 9 schematically depicts exclusively processing of the relevant front side of the silicon semiconductor wafer and that depositions performed on the rear side and their back-etching processes are not included.

At the beginning of the process, in order to realize a trench capacitor 100 in accordance with an embodiment, silicon substrate 110 representing a first electrode structure is structured with holes $111_1$ to $111_3$. By means of a lithography 310, the hole structure is transferred to the surface and, on the basis thereof, is etched 320 into the depth of the substrate. This is followed by the different processes for depositing 330 the individual layers 132 and $133_1$ to $133_3$ of the dielectric 130, i. e. of the dielectric layer structure, and for depositing 340 the electrode 120, i. e. the second electrode structure. Moreover, the method optionally includes producing 350 a front-side contact 122 and a rear-side contact 112. The electrode 120, consisting of, e. g., polycrystalline silicon, and the front-side contact 122 made of, e. g., aluminum, define dimensions of the component. In order to avoid air sparkover between the front 122 and rear-side contacts 112 of the singulated components, polyimide is optionally applied on the edges of the components.

In accordance with an embodiment, the inventive capacitor 100 is built on a silicon semiconductor wafer (i. e. silicon substrate 110) p-doped with boron, which wafer comprises, e. g., a diameter of 150 mm, a thickness of 675 μm, and a layer resistivity of 9±0.3 ohm*cm. By applying a lithography 310, e. g., a hexagonal hole structure as described in FIG. 4b and FIG. 5a is produced on the surface of the silicon 110.

Etching 320 of the holes $111_1$ to $111_3$ is effected, for example, by means of an ASE (advanced silicon etching) process, which is an alternating dry-etching process. On the basis of the lithography 310 for producing a hole mask 312, one alternates, in etching 320 the holes $111_1$ to $111_3$, between an ion etching step and a passivating step, in accordance with an embodiment. For passivation, a protective layer is deposited, for example, in between the individual, non-fully anisotropic etching steps, which protective layer serves to maintain the etching direction and to protect the walls, which have already been etched, of the hole $111_1$ to $111_3$ against further material removal.

In accordance with an embodiment, the dielectric 130 consists of a silicon dioxide layer 132 and three subsequent silicon nitride layers $133_1$ to $133_3$ of different properties. They are referred to as silicon nitride1 $133_1$, silicon nitride2 $133_2$, and silicon nitride3 $133_3$, in accordance with their order of deposition. Initially, the $SiO_2$ layer 132 is deposited 330 on the silicon substrate at 1050° C., for example, by means of thermal oxidation based on a natural reaction of silicon (Si) with oxygen ($O_2$) to yield silicon dioxide ($SiO_2$).

A silicon nitride layer $133_1$ to $133_3$ is produced, e. g., by means of a chemical reaction of dichlorosilane ($SiCl_2H_2$) with ammonia ($NH_3$). Depositions 330 of the different silicon nitride layers $133_1$ to $133_3$ take place, e. g., by means of a low-pressure chemical vapor deposition (LPCVD) at a low pressure (about 17 Pa-27 Pa) as the atmospheric pressure and at a temperature of between 700° C. and 800° C.

The chemical reaction equation for depositing 330 stoichiometric silicon nitride ($Si_3N_4$) is $3\ SiCl_2H_2 + 4NH_3 \rightarrow Si_3N_4 + 6\ HCl + 6H_2$. As side products of the reaction, hydrogen chloride (HCl) and hydrogen ($H_2$) are formed.

During deposition 330 of low-stress silicon nitride ($Si_xN_y$), the ratio of the reaction gases dichlorosilane and ammonia is changed. The higher the proportion of dichlorosilane as compared to ammonia, the higher the proportion of silicon will be in the resulting silicon nitride. As a result, what is deposited 330 is not silicon nitride having a ratio of three to four between silicon and nitride as in the stoichiometric case, but a silicon-rich silicon nitride and/or non-stoichiometric silicon nitride, which is also referred to as a low-stress silicon nitride $Si_xN_y$.

In the production 330 of the dielectric 130, therefore, in accordance with an embodiment, an $SiO_2$ layer is initially deposited onto the silicon substrate, followed by combinations of layers $133_1$ to $133_3$ including at least one $Si_3N_4$ layer and at least one $Si_xN_y$ layer.

As the front-side electrode 120, i. e. as the second electrode structure, e. g. polycrystalline silicon is grown 340 by means of an LPCVD method by using monosilane ($SiH_4$) $SiH_4 \rightarrow Si + 2H_2$. In this process, the polysilicon is deposited on the dielectric layer stack 130 in the holes $111_1$ to $111_3$ by means of, e. g., pyrolytic decomposition of silane at 600° C. to 650° C. As said deposition in the hole structure continues, the electrode 120 that may be used is formed by the time an increased capacitance value is achieved. In accordance with an embodiment, doping of the polysilicon with phosphorus and argon is effected, during deposition, by an additional gas supply of monophosphane ($PH_3$) and argon (Ar).

In accordance with an embodiment, a further layer is deposited onto the polysilicon layer, i. e. onto the second electrode structure 120, for forming the front-side contact 122 with, e. g., aluminum. Said further layer is deposited, e. g., by means of a physical vapor deposition (PVD) method. Aluminum is low in resistance and forms reliable contacting of the individual components. Finally, the dimension of the component is optionally transferred to the silicon semiconductor wafer by means of a lithography, and the layers of polysilicon and aluminum that are present between the resulting components are ablated by using a dry-etching process.

For contacting the rear side of the silicon semiconductor wafer 110, in accordance with an embodiment, all of the layers that are additionally grown, or deposited, onto the rear side during the desired layer deposition on the front side, are initially etched back. For contacting the rear side, e. g. a solderable layer stack 112 of chromium, nickel and silver is subsequently vapor deposited.

In accordance with an embodiment, an integrated capacitor comprises a first electrode structure, a second electrode structure, and an interposed dielectric layer structure, the dielectric layer structure comprising a layer combination having an $SiO_2$ layer, an $Si_3Na$ layer, and an $Si_xN_y$ layer, and the $Si_xN_y$ layer comprising non-stoichiometric silicon nitride material with an increased proportion of silicon.

In accordance with one aspect, the first electrode structure comprises a semiconductor substrate provided with a trench structure.

In accordance with a further aspect, the first electrode structure forms a rear-side electrode arranged at a rear-side contact; and the second electrode structure forms a front-side electrode arranged at a front-side contact.

In accordance with a further aspect, a ratio of silicon to nitrogen of the $Si_xN_y$ layer is from 0.8 to 1.

In accordance with a further aspect, the dielectric layer structure comprises a larger proportion of an $Si_3N_4$ material than of any material deviating therefrom.

In accordance with a further aspect, a thickness of the $Si_3N_4$ layer is formed to have a ratio of n to one to a thickness of the $Si_xN_y$ layer, n ranging from 1.5 to 2.5.

In accordance with a further aspect, the $Si_xN_y$ layer is arranged separately from, or not directly adjacent to, the $SiO_2$ layer.

In accordance with a further aspect, the thickness of the $Si_xN_y$ layer corresponds to a maximum of 33% of the overall thickness of all $Si_xN_y$ layers and $Si_3N_4$ layers.

In accordance with a further aspect, a thickness of the $Si_xN_y$ layer corresponds to a maximum of 50% of an overall thickness of all $Si_3N_4$ layers.

In accordance with a further aspect, the dielectric layer structure of the integrated capacitor comprises an effective oxide thickness of at least 1200 nm and a dielectric strength of at least 900 V.

In accordance with an embodiment, a method of producing an integrated capacitor comprises producing a dielectric layer structure within a trench structure of a semiconductor substrate, the dielectric layer structure comprising a plurality or a combination of mutually adjoining dielectric layers, at least one of the dielectric layers comprising an $SiO_2$ material, at least one of the dielectric layers comprising an $Si_3N_4$ material, and at least one of the dielectric layers comprising an $Si_xN_y$ material, the $Si_xN_y$ material comprising non-stoichiometric silicon nitride having an increased proportion of silicon.

In accordance with one aspect, the dielectric layer structure comprises a plurality or a combination of an $SiO_2$ layer, an $Si_3N_4$ layer, and an $Si_xN_y$ layer.

In accordance with a further aspect, a ratio of silicon to nitrogen of the $Si_xN_y$ layer ranges from 0.8 to 1.

In accordance with a further aspect, the dielectric layer structure comprises a higher proportion of the $Si_3N_4$ material than of any material deviating therefrom.

In accordance with a further aspect, a thickness of the $Si_3N_4$ layer is formed to have a ratio of n to one to a thickness of the $Si_xN_y$ layer, n ranging from 1.5 to 2.5.

In accordance with a further aspect, the $Si_xN_y$ layer is not arranged directly adjacent to the $SiO_2$ layer.

One embodiment relates to a method of any of the above-described embodiments.

A further embodiment relates to a device of any of the above-described embodiments.

A further embodiment relates to a production method of any of the above-described embodiments.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described in connection with or as a method step also represent a description of a corresponding block or detail or feature of a corresponding device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] S. Banzhaf et al, "Stress reduction in high voltage MIS capacitor fabrication", 19th International Symposium POWER ELECTRONICS Ee2017, Novi Sad, Serbia, 2017.

[2] S. Berberich, M. März, U.S. Pat. No. 7,738,226.

[3] T. Erlbacher, H. Schwarzmann, A. J. Bauer, "Improving module performance and reliability in power electronic applications by monolithic integration of RC-snubbers", Proc. Internat. Symp. On Power Semicond. Dev. & ICs (ISPSD), Brugge, 283-286.

[4] J. vom Dorp, T. Erlbacher, V. Lorentz, A. J. Bauer, H. Ryssel, L. Frey, "Integrierbare Bauelemente zur Erhöhung der Betriebssicherheit elektronischer Systemkomponenten im Automobil", Automotive meets Electronics 2010, Dortmund pp. 72-77.

[5] F. Krach, T. Heckel, L. Frey, A. J. Bauer, T. Erlbacher and M. Maerz, "Innovative monolithic RC-snubber for fast switching power modules", 9th International Conference on Integrated Power Electronics Systems CIPS2016, Nuremberg, Germany, 2016, pp. 1-6.

[6] S. Banzhaf et al., "Post-trench processing of silicon deep trench capacitors for power electronic applications", 28th International Symposium on Powersemiconductor Devices and ICs ISPSD 2016, Prague, Czech Republic, 2016.

[7] Hakim et al., "Nonlinear capacitors integration", Proc. Internat. Semiconductor Conference 2000, Sinaia, pp. 303-306 vol:1,2000.

[8] J. vom Dorp, T. Erlbacher, A. J. Bauer, H. Ryssel, L. Frey, "Dielectric layers suitable for high voltage integrated trench capacitors", J. Vac. Sci. Technol. B 29(1), 01AB04, 2011.

[9] F. Krach, H. Schwarzmann, A. J. Bauer, T. Erlbacher, and L. Frey, "Silicon nitride, a high potential dielectric for 600 V integrated RC-snubber applications", Journal of Vacuum Science and Technology B, 33, pp. 01A1112, 2015.

[10] J. Gardeniers, H. Tilmans and C. Visser, "LPCVD silicon-rich silicon nitride films for applications in micromechanics, studied with statistical experimental design", J. Vac. Sci. Technol. A 14(5), September/October 1996.

[11] V. Prodanovic et al., "Optimization of silicon-rich silicon nitride films for electron multiplication in timed photon counters", EUROSENSORS 2015.

The invention claimed is:

1. An integrated trench capacitor, comprising:
   a first electrode structure, a second electrode structure, and a dielectric layer structure interposed between the first electrode structure and the second electrode structure,
   wherein the first electrode structure comprises a semiconductor substrate provided with a trench structure,
   wherein the dielectric layer structure comprises a layer combination comprising an $SiO_2$ layer, an $Si_3N_4$ layer, and an $Si_xN_y$ layer,
   wherein the $Si_xN_y$ layer comprises non-stoichiometric silicon nitride material that is silicon-rich silicon nitride material,
   wherein a thickness of the $Si_3N_4$ layer to a thickness of the $Si_xN_y$ layer is configured to be in a ratio of n to one, wherein n is ranging from 1.5 to 2.5, and
   wherein the dielectric layer structure is arranged within the trench structure.

2. The integrated trench capacitor as claimed in claim 1, wherein the first electrode structure forms a rear-side electrode arranged at a rear-side contact; and
   wherein the second electrode structure forms a front-side electrode arranged at a front-side contact.

3. The integrated trench capacitor as claimed in claim 1, wherein a ratio of silicon to nitrogen of the $Si_xN_y$ layer ranges from 0.8 to 1.

4. The integrated trench capacitor as claimed in claim 1, wherein the $Si_xN_y$ layer is arranged separately from, or not directly adjacent to, the $SiO_2$ layer.

5. The integrated trench capacitor as claimed in claim 1, wherein the dielectric layer structure of the integrated capacitor comprises an effective oxide thickness of at least 1200 nm and a dielectric strength of at least 900 V.

6. The integrated trench capacitor as claimed in claim 1, wherein a thickness of the $Si_xN_y$ layer ranges from 50 nm to 2000 nm, from 50 nm to 1000 nm, from 50 nm to 500 nm, or from 100 nm to 1000 nm.

7. The integrated trench capacitor as claimed in claim 1, wherein the dielectric layer structure comprises a layer combination comprising an $SiO_2$ layer, two $Si_3N_4$ layers, and an $Si_xN_y$ layer.

8. The integrated trench capacitor as claimed in claim 7, wherein the $Si_xN_y$ layer is arranged between the two $Si_3N_4$ layers.

9. The integrated trench capacitor as claimed in claim 1, wherein the dielectric layer structure comprises a layer combination comprising an $SiO_2$ layer, an $Si_3N_4$ layer, and two $Si_xN_y$ layers.

10. The integrated trench capacitor as claimed in claim 9, wherein the $Si_3N_4$ layer is arranged between the two $Si_xN_y$ layers.

11. A method of producing an integrated trench capacitor, comprising:
    providing a first electrode structure, a second electrode structure, and a dielectric layer structure interposed between the first electrode structure and the second electrode structure, wherein the first electrode structure comprises a semiconductor substrate provided with a trench structure; and
    producing the dielectric layer structure within the trench structure of the semiconductor substrate,
    wherein the dielectric layer structure comprises a plurality or a combination of mutually adjoining dielectric layers,
    at least one of the dielectric layers comprising $SiO_2$ material,
    at least one of the dielectric layers comprising $Si_3N_4$ material, and
    at least one of the dielectric layers comprising $Si_xN_y$ material,
    wherein the $Si_xN_y$ material comprises non-stoichiometric silicon nitride material that is silicon-rich silicon nitride material, and
    wherein a thickness of the $Si_3N_4$ layer to a thickness of the $Si_xN_y$ layer is configured to be in a ratio of n to one, wherein n is ranging from 1.5 to 2.5.

12. The method as claimed in claim 11, wherein the dielectric layer structure comprises a plurality or a combination of a dielectric layer comprising $SiO_2$ material, a dielectric layer comprising $Si_3N_4$ layer material, and a dielectric layer comprising $Si_xN_y$ material.

13. The method as claimed in claim 12, wherein a ratio of silicon to nitrogen of the dielectric layer comprising $Si_xN_y$ material ranges from 0.8 to 1.

14. The method as claimed in claim 11, wherein the dielectric layer structure comprises a higher proportion of the $Si_3N_4$ material than of any material deviating therefrom.

15. The method as claimed in claim 11, wherein the dielectric layer comprising $Si_xN_y$ material is not arranged directly at the dielectric layer comprising $SiO_2$ material.

* * * * *